United States Patent
Konrath et al.

(10) Patent No.: US 9,966,348 B2
(45) Date of Patent: May 8, 2018

(54) METHOD FOR PROCESSING AN ELECTRONIC COMPONENT AND AN ELECTRONIC COMPONENT

(71) Applicant: Infineon Technologies AG, Neubiberg (DE)

(72) Inventors: Jens Peter Konrath, Villach (AT); Jochen Hilsenbeck, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days. days.

(21) Appl. No.: 15/716,534

(22) Filed: Sep. 27, 2017

(65) Prior Publication Data

US 2018/0019218 A1 Jan. 18, 2018

Related U.S. Application Data

(63) Continuation of application No. 15/135,586, filed on Apr. 22, 2016, now Pat. No. 9,806,041.

(51) Int. Cl.
*H01L 23/52* (2006.01)
*H01L 23/00* (2006.01)

(52) U.S. Cl.
CPC ...... *H01L 24/03* (2013.01); *H01L 2224/0345* (2013.01); *H01L 2224/0391* (2013.01); *H01L 2224/05557* (2013.01); *H01L 2224/05558* (2013.01); *H01L 2224/05582* (2013.01); *H01L 2224/05666* (2013.01)

(58) Field of Classification Search
None
See application file for complete search history.

(56) References Cited

U.S. PATENT DOCUMENTS 4,924,295 A * 5/1990 Kuecher ............ H01L 21/7684
257/751

* cited by examiner

*Primary Examiner* — Charles Garber
*Assistant Examiner* — Alia Sabur
(74) *Attorney, Agent, or Firm* — Viering, Jentschura & Partner mbB

(57) ABSTRACT

According to various embodiments an electronic component includes: at least one electrically conductive contact region; a contact pad including a self-segregating composition disposed over the at least one electrically conductive contact region; a segregation suppression structure disposed between the contact pad and the at least one electrically conductive contact region, wherein the segregation suppression structure includes more nucleation inducing topography features than the at least one electrically conductive contact region for perturbing a chemical segregation of the self-segregating composition by crystallographic interfaces of the contact pad defined by the nucleation inducing topography features.

20 Claims, 20 Drawing Sheets

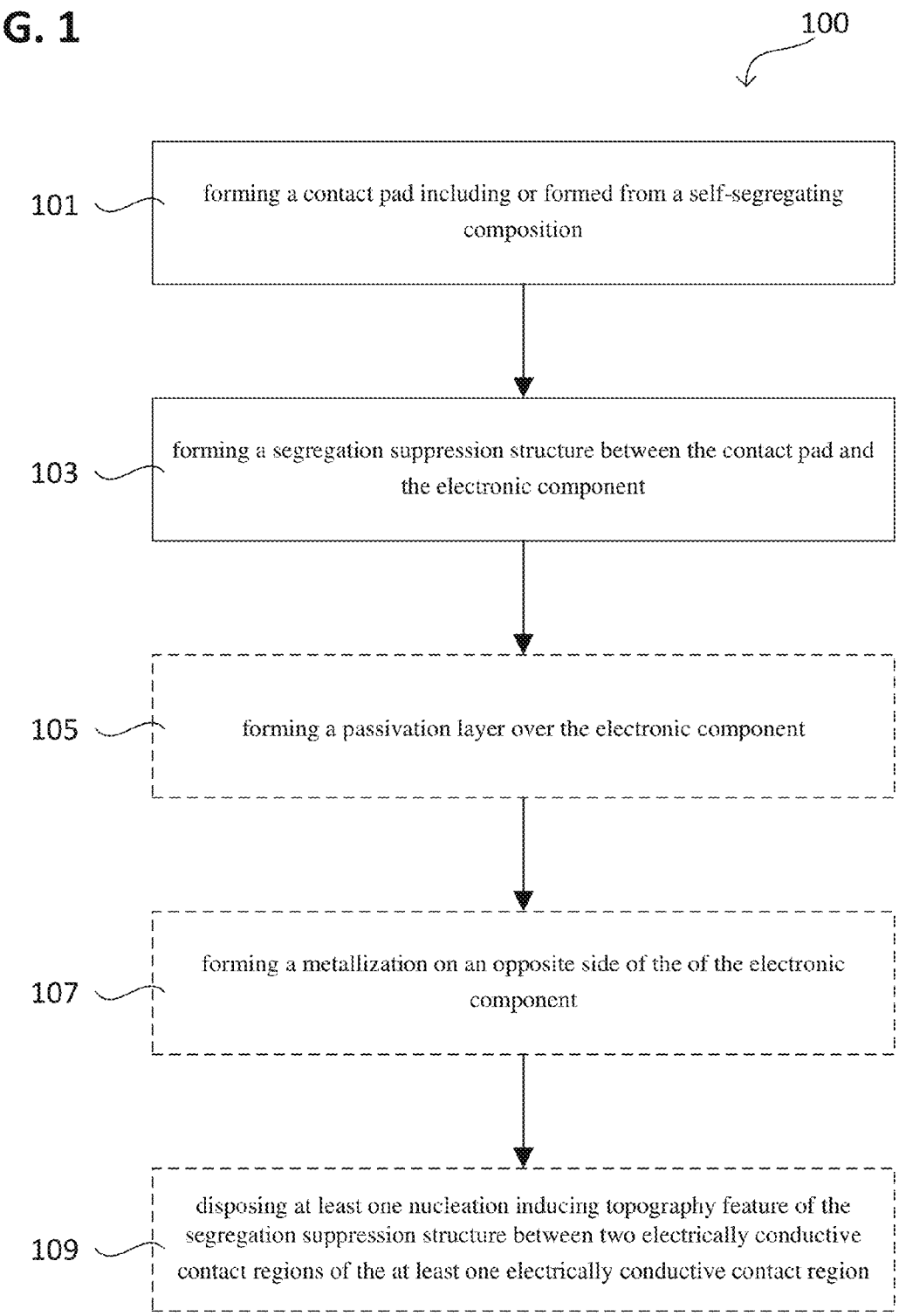

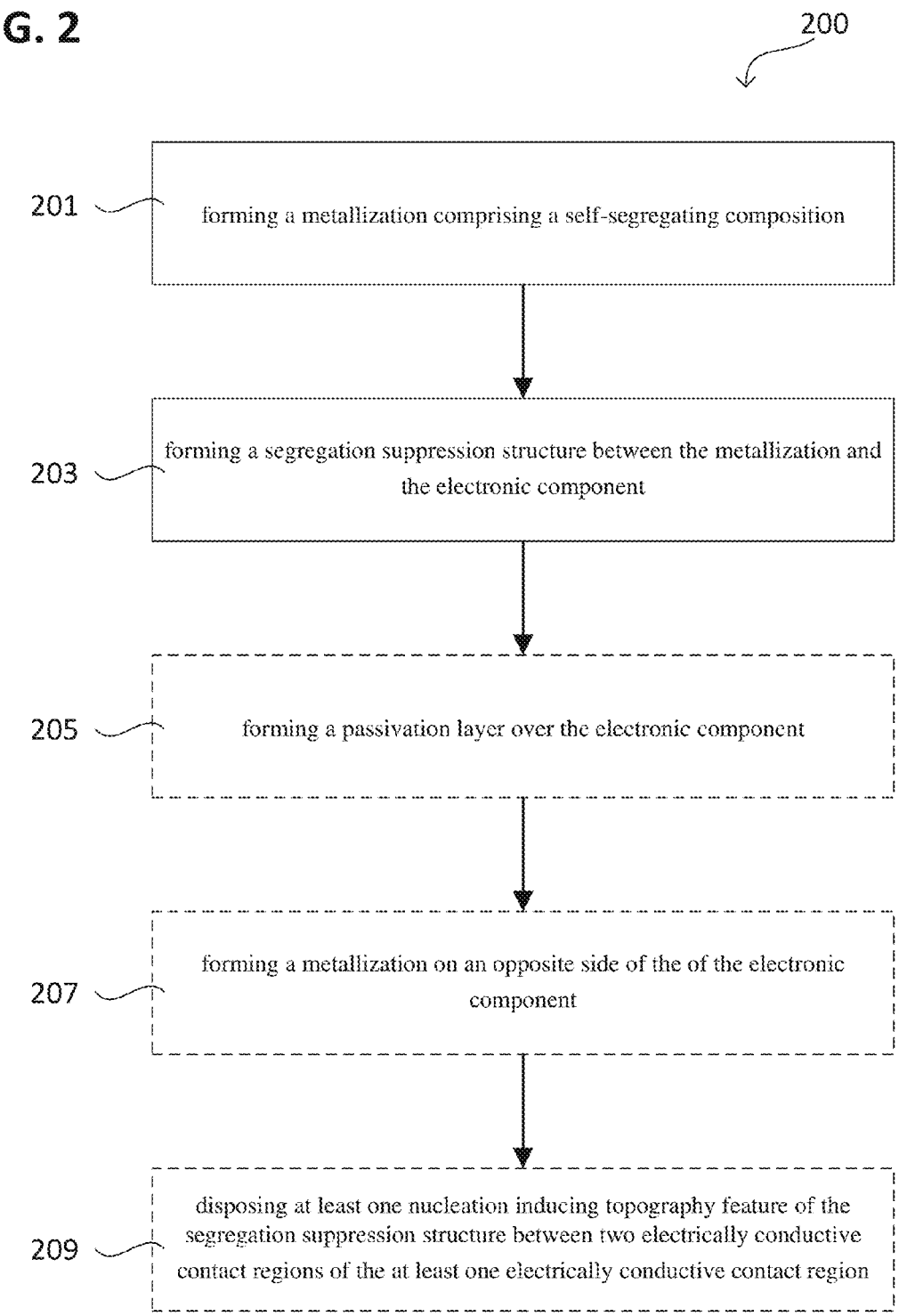

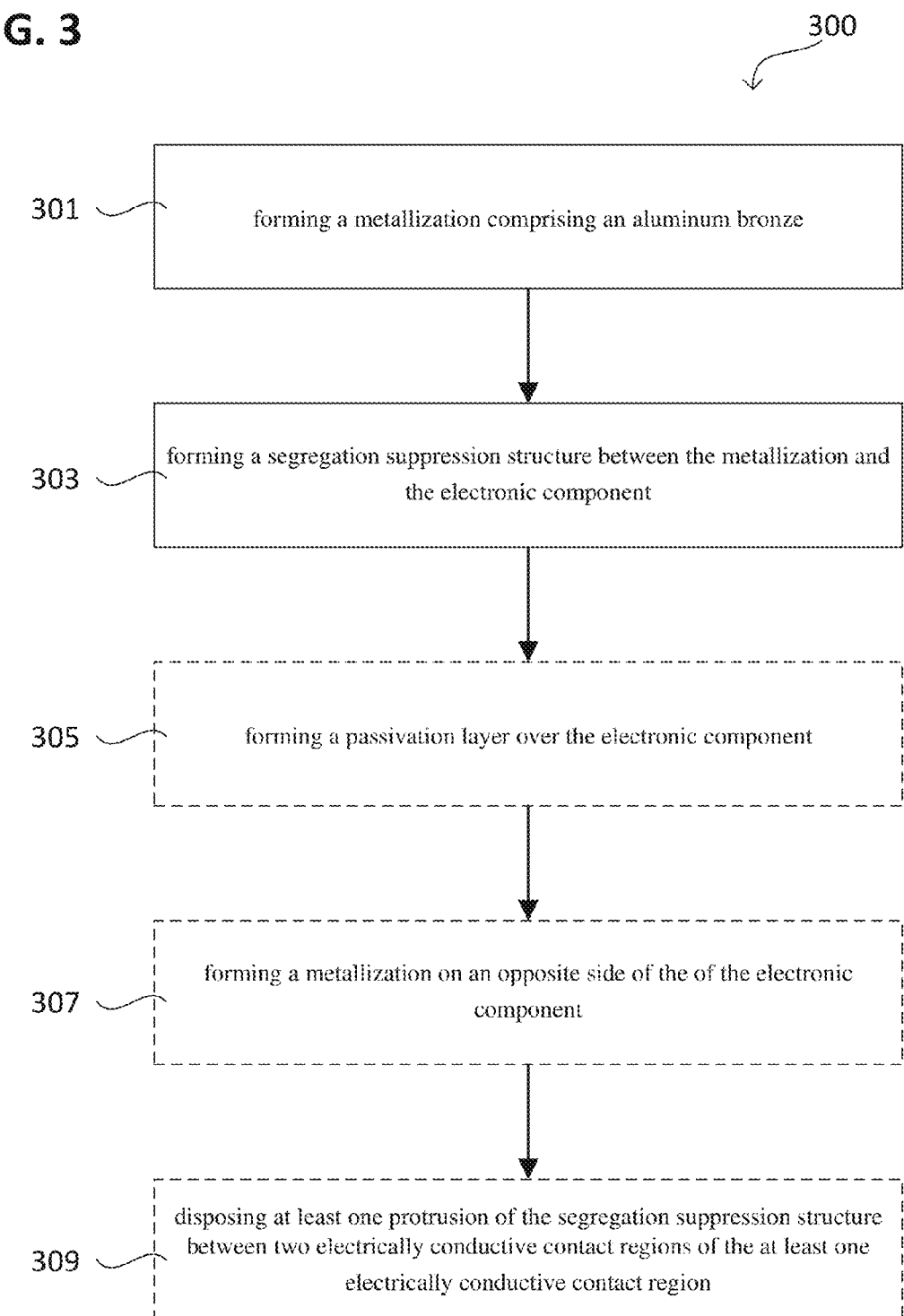

METHOD FOR PROCESSING AN ELECTRONIC COMPONENT AND AN ELECTRONIC COMPONENT

CROSS-REFERENCE TO RELATED APPLICATIONS

This application is a continuation of U.S. application Ser. No. 15/135,586, filed on Apr. 22, 2016, the entire contents of which are hereby incorporated herein by reference.

TECHNICAL FIELD

Various embodiments relate generally to a method for processing an electronic component and an electronic component.

BACKGROUND

In general, a metal alloy (e.g., an aluminum-copper alloy) may be susceptible to pitting corrosion (also referred to as pitting). Pitting corrosion may refer to as an extremely localized corrosion that impairs the metal alloy, e.g., by the formation of holes. Pitting corrosion may be induced by stoichiometric inhomogeneities leading to an anodic-cathodic coupling, which induces localized galvanic corrosion in the spatial scale of the stoichiometric inhomogeneities. Therefore, pitting corrosion may also occur in otherwise corrosion-resistant alloys.

By way of example, in case of intergranular corrosion (also referred to as intergranular attack) the boundaries of crystallites of the metal alloy may be more susceptible to corrosion than their insides, e.g., when the grain boundaries are depleted (also referred to as grain boundary depletion) of the corrosion-inhibiting elements such as chromium. In nickel alloys and austenitic stainless steels, where chromium is added for corrosion resistance, the formation of chromium-depleted zones adjacent to the grain boundaries may be induced by precipitations of chromium carbide at the grain boundaries. The grain boundary depletion may induce local galvanic coupling, causing local galvanic corrosion.

Alternatively or additionally, a chemical activating environment may induce or enhance pitting corrosion. By way of example, wet chemical treatment of an aluminum-copper alloy may result in galvanic deposition of copper from the solution and aluminium corrosion. Alternatively or additionally, pitting corrosion may be induced or enhanced by an electrical current flowing through the metal alloy.

Conventionally, pitting corrosion may be reduced by an artificial passivation (e.g., using a protection nitride) of the metal alloy. However, the artificial passivation may obstruct electrical contact of electronic components, e.g., if the metal alloy provides a contact pad. For electrical contacting, the artificial passivation may be locally removed by dry etching to expose the metal alloy, e.g., for bonding the exposed region of the contact pad. In this case, the dry etching may also attack the inherent passivation (e.g., aluminium oxide) of the metal alloy and, thereby, increase the risk of pitting corrosion proximate the electrical contact. Alternatively, the bonding parameters may be adapted for bonding through the artificial passivation, which may result in a weakened electrical contact. Further, if the artificial passivation includes a metal, the artificial passivation may form a galvanic element with the metal alloy, thereby, inducing galvanic corrosion itself.

SUMMARY

According to various embodiments, a method for processing an electronic component including at least one electrically conductive contact region may include: forming a contact pad including a self-segregating composition over the at least one electrically conductive contact region to electrically contact the electronic component; forming a segregation suppression structure between the contact pad and the electronic component, wherein the segregation suppression structure includes more nucleation inducing topography features than the at least one electrically conductive contact region for perturbing a chemical segregation of the self-segregating composition by crystallographic interfaces of the contact pad defined by the nucleation inducing topography features.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1 to FIG. 3 respectively show a method according to various embodiments in a schematical flow diagram;

DESCRIPTION

Figure 4A:
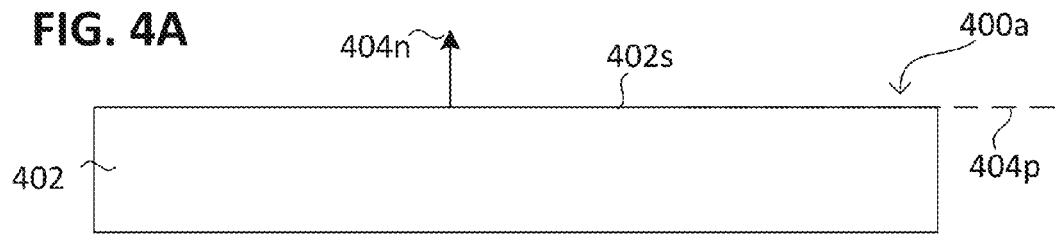
FIG. 4A to FIG. 4D respectively show an electronic component in a method according to various embodiments in a schematical cross sectional view or side view.
Figure 4B:
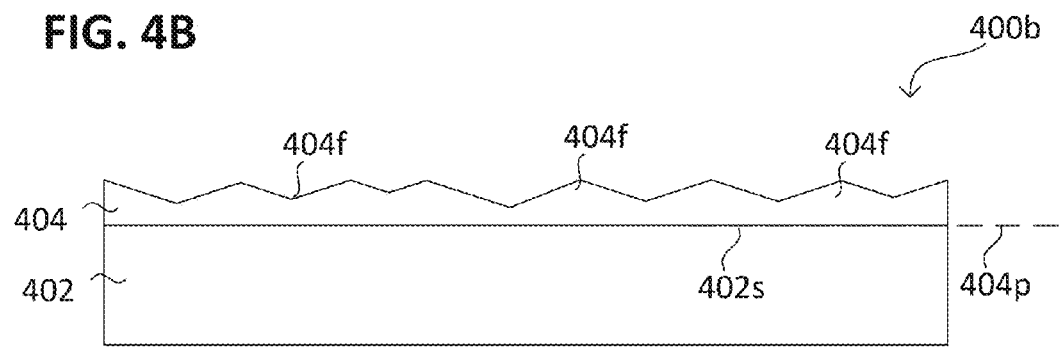
Figure 4C:
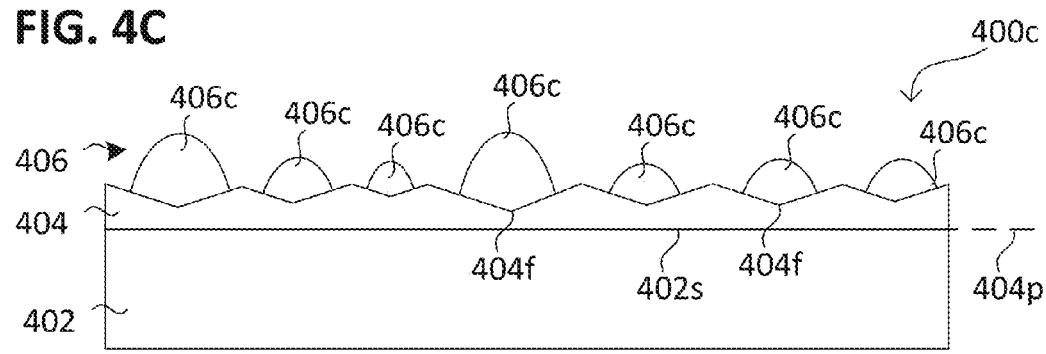
Figure 4D:
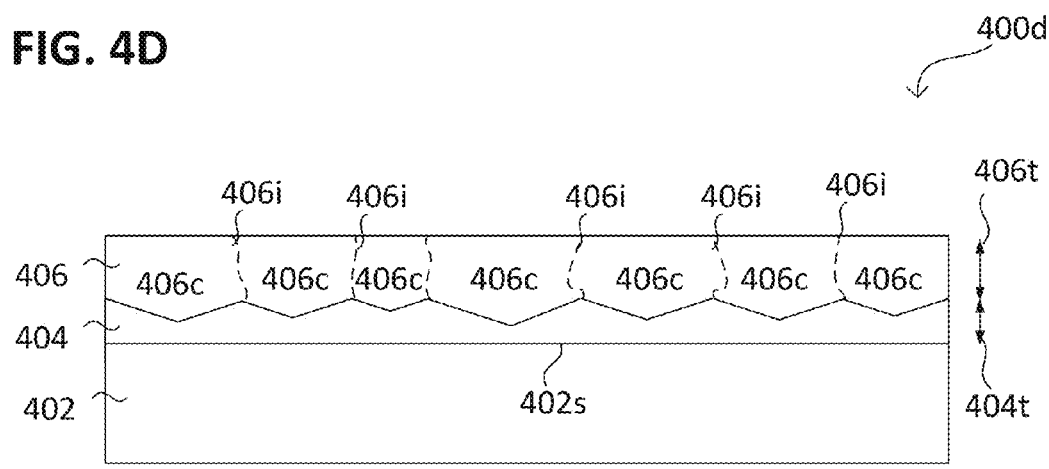

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g., in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

The term "lateral" used with regards to the "lateral" extension of a structure (or of a substrate, a wafer, or a carrier) or "laterally" next to, may be used herein to mean an extension or a positional relationship along a surface of a substrate, a wafer, or a carrier. That means that a surface of a substrate (e.g., a surface of a carrier, or a surface of a wafer) may serve as reference, commonly referred to as the main processing surface of the substrate (or the main processing surface of the carrier or wafer). Further, the term "width" used with regards to a "width" of a structure (or of a structure element) may be used herein to mean the lateral extension of a structure. Further, the term "height" used with regards to a height of a structure (or of a structure element), may be used herein to mean an extension of a structure along a direction perpendicular to the surface of a substrate (e.g., perpendicular to the main processing surface of a substrate). The term "thickness" used with regards to a "thickness" of a layer may be used herein to mean the spatial extension of the layer perpendicular to the surface of the support (the material) on which the layer is deposited. If the surface of the support is parallel to the surface of the substrate (e.g., to the main processing surface) the "thickness" of the layer deposited on the support may be the same as the height of the layer. Further, a "vertical" structure may be referred to as a structure extending in a direction perpendicular to the lateral direction (e.g., perpendicular to the main processing surface of a substrate) and a "vertical" extension may be referred to as an extension along a direction perpendicular to the lateral direction (e.g., an extension perpendicular to the main processing surface of a substrate).

The phrase "at least one of" in regard to a group of elements may be used herein to mean at least one element from the group consisting of the elements. For example, the phrase "at least one of" in regard to a group of elements may be used herein to mean a selection of: one of the listed elements, a plurality of one of the listed elements, a plurality of individual listed elements, or a plurality of a multiple of listed elements.

According to various embodiments, pitting corrosion (e.g., copper pitting) may be reduced. Illustratively, the stoichiometric inhomogeneities leading to localized galvanic corrosion may be reduced. Therefore, the amount of intergranular boundaries (also referred to as crystallographic interfaces) may be increased to obstruct stoichiometric depletion by constituent migration (e.g., diffusion). Alternatively or additionally, the spatially averaged grain size (also referred to as crystallite size) may be reduced to reduce the total stoichiometric variation. Illustratively, the constituent migration (e.g., diffusion) may occur within a grain (also referred to as crystallite) such that stoichiometric variations may be reduced to the spatial scale of the grain size. This may reduce or avoid grain boundary depletion. In other words, the galvanic corrosion (in the spatial scale of the stoichiometric inhomogeneities) may be reduced by refining the microstructure.

According to various embodiments, pitting corrosion (e.g., copper pitting) of a contact pad may be reduced by changing the inherent grain size using a structured liner. The structured liner may underlay the contact pad. For example, the segregation suppression structure may include or be formed from the liner.

According to various embodiments, a diode (e.g., a shottky diode) may be provided. After implantation and forming an ohmic contact (e.g., a nickel aluminum contact) on the front side of the diode, the liner may be formed over the ohmic contact. The liner (e.g., a liner layer) may be structured using a mask to form the segregation suppression structure. The mask may include or be formed from a resin mask. Structuring the liner may include using dry etching (e.g., plasma etching). The dry etching may provide stop etching within the liner (e.g., to avoid etching through the liner). After removing the mask, a metallization may be disposed over the segregation suppression structure. For example, the metallization may include or be formed from an aluminium-copper alloy. The metallization may be structured using a mask to form at least one contact pad. Structuring the metallization may include using wet etching (e.g., using a liquid etchant). After structuring the metallization, the remaining liner (e.g., exposed by structuring the metallization) may be optionally removed using the same mask as for structuring the metallization or another mask. Further, at least one passivation layer may be disposed over the metallization (e.g., over the at least one contact pad). Subsequently, the backside of the diode may be processed (e.g., including at least one of thinning and forming a backside metallization).

According to various embodiments, forming the segregation suppression structure may be provided within a front-end process. Processing the backside of the diode may be the last step of the front-end process. In analogy, other electronic components may be processed.

According to various embodiments, a semiconductor device may include one or more integrated circuit structures (also referred to as integrated electronic component, semiconductor chip, IC, chip, or microchip) which are formed during semiconductor device fabrication. An integrated circuit structure may be processed at least partially at least one of over or in a substrate in corresponding regions of the substrate (also referred to as active chip regions) utilizing various semiconductor processing technologies. An integrated circuit structure may include one or more (e.g., a plurality of) semiconductor circuit elements (also referred to as integrated electronic elements), such among others may be at least one of diodes, transistors, resistors, capacitors, which are electrically interconnected and configured to perform operations, e.g., at least one of computing operations, switching operations (e.g., in power electronics), rectifier operations, or storage operations, e.g., in the completely processed integrated circuit structure. In further semiconductor device fabrication, a plurality of semiconductor devices may be singulated from the substrate (also referred to as a wafer or a carrier) after the semiconductor device processing by wafer-dicing to provide a plurality of singulated semiconductor devices (also referred to as semiconductor chips) from the plurality of semiconductor devices. Further, a final stage of semiconductor device fabrication may include packaging (also referred to as assembly, encapsulation, or seal) of singulated semiconductor devices, wherein a singulated semiconductor device may be encased, e.g., into a supporting material (also referred to as molding material or encapsulation material) to prevent physical damage and/or corrosion of the semiconductor device. The supporting material encases the semiconductor device (illustratively, forms a package or mold) and may optionally support the electrical contacts and/or a lead frame to connect the semiconductor device to a peripheral device, e.g., to a circuit board.

According to various embodiments, during electronic component fabrication, various material types may be processed to form at least one of: an integrated circuit structure, a semiconductor circuit element, a contact pad, an electrical interconnection, such among other may be electrically insulating materials, electrically semiconducting materials (also referred to as semiconductor material) or electrically conductive materials (also referred to as electrically conducting materials).

According to various embodiments, at least one of a substrate and a semiconductor region may include or be formed from a semiconductor material of various types, including a group IV semiconductor (e.g., silicon or germanium), a compound semiconductor, e.g., a group III-V compound semiconductor (e.g., gallium arsenide) or other types, including group III semiconductors, group V semiconductors or polymers, for example. In an embodiment, at least one of the substrate and the semiconductor region is made of silicon (doped or undoped), in an alternative embodiment, at least one of the substrate and the semiconductor region is a silicon on insulator (SOI) wafer. As an alternative, any other suitable semiconductor material can be used for at least one of the substrate and the semiconductor region, for example a semiconductor compound material such as gallium phosphide (GaP), indium phosphide (InP), silicon carbide (SiC) or gallium nitride (GaN), but also any suitable ternary semiconductor compound material or quaternary semiconductor compound material such as indium gallium arsenide (InGaAs).

According to various embodiments, a metallic material may include or be formed from at least one chemical element of the following group of chemical elements (also referred to as metals): tungsten (W), aluminum (Al), copper (Cu), nickel (Ni), magnesium (Mg), chromium (Cr), iron (Fe), zinc (Zn), tin (Sn), gold (Au), silver (Ag), iridium (Ir), platinum (Pt), indium (In), cadmium (Cd), bismuth (Bi), vanadium (V), titanium (Ti), palladium (Pd), or zirconium (Zr); or may include or be formed from a metal alloy including at least one chemical element of the group of chemical elements. By way of example, a metal alloy may include or be formed from at least two metals (e.g., two or more than two metals, e.g., in the case of an intermetallic compound) or at least one metal (e.g., one or more than one metal) and at least one other chemical element (e.g., a non-metal or a half metal). By way of example, a metal alloy may include or may be formed from at least one metal and at least one non-metal (e.g., carbon (C) or nitrogen (N)), e.g., in the case of steel, a carbide or a nitride. By way of example, a metal alloy may include or may be formed from more than one metal (e.g., two or more metals), e.g., various compositions of gold with aluminum, various compositions of copper with aluminum (e.g., aluminum bronze), various compositions of copper and zinc (e.g., "brass") or various compositions of copper and tin (e.g., "bronze"), e.g., including various intermetallic compounds. According to various embodiments, a metallic material may be electrically conductive.

A semiconductor material, layer, region or the like may be understood as having moderate electrical conductivity (also referred to as semiconducting), e.g., an electrical conductivity (measured at room temperature and constant electric field direction, e.g., constant electric field) in the range from about $10^{-6}$ Sievert per meter (S/m) to about $10^6$ S/m.

According to various embodiments, an electrically conductive material, layer, region or the like may include or may be formed from a metallic material (e.g., a metal or a metal alloy), a silicide (e.g., titanium silicide, molybdenum silicide, tantalum silicide or tungsten silicide), a conductive polymer, a polycrystalline semiconductor (e.g., polycrystalline silicon also referred to as polysilicon), or a highly doped semiconductor (e.g., highly doped silicon). An electrically conductive material (e.g., a metallic material), layer, region or the like may be understood as having high electrical conductivity (also referred to as electrically conductive), e.g., an electrical conductivity (measured at room temperature and constant electric field direction, e.g., constant electric field) greater than about $10^6$ S/m, e.g., greater than about $10^7$ S/m.

An electrically insulating material, layer, region or the like may be understood as having a low electrical conductivity (also referred to as electrically insulating), e.g., an electrical conductivity (measured at room temperature and constant electric field direction, e.g., constant electric field) less than about $10^{-6}$ S/m, e.g., less than about $10^{-10}$ S/m.

According to various embodiments, a transistor may be one of various types of a transistors, such as among others may be a bipolar transistor (BJT), a heterojunction BJP, a Schottky BJP, an insulated-gate BJP (also referred to as IGBT), a field-effect transistor (FET), a junction field-effect transistor JFET), a metal-oxide-semiconductor field-effect transistor (MOSFET), a dual-gate MOSFET, a fast-reverse or fast-recovery epitaxial diode FET, a heterostructure insulated gate FET, a modulation-doped FET, a tunnel FET, an insulated-gate bipolar transistor (IGBT). In dependency of the specific semiconductor technology in which a transistor is fabricated, various materials are processed for forming the corresponding layers. For example, a transistor may be processed in complementary metal-oxide-semiconductor (CMOS) technology and/or in double-diffused metal-oxide-semiconductor (DMOS) technology.

Segregation (also referred to as chemical segregation) may be understood as the enrichment of a constituent of a composition (e.g., the self-segregating composition) at a surface, e.g., a free surface or an internal interface (like a crystallographic interface), of the composition (and respective depletion of another constituent of the composition at the surface). The constituent may migrate (e.g. diffuse) from a central region of the composition or crystal to the surface of the composition (e.g., a crystallographic interface). The migration may be activated by temperature, e.g., above room temperature, e.g., at or above a segregation temperature. Alternatively or additionally, the migration may be activated during adsorption of the composition (e.g., during growth of a layer or structure having the composition), e.g., activated by adsorption dynamics.

Illustratively, by the structure of the segregation suppression structure, the grain size of the self-segregating composition (e.g., AlCu) may be influenced thereby reducing a compositional segregation of the composition. For example, the segregation suppression structure may include or be formed from Titanium.

The self-segregating composition may include at least one self-segregating alloying element (also referred to as at least one alloying element), e.g., the second metal, disposed in a host material (e.g., mixed with it), e.g., the first metal. The self-segregating composition may be a metastable composition, e.g., above an equilibrium solubility and/or within a miscibility gap. For example, the self-segregating alloying element may be soluble in the host material up to the equilibrium solubility, wherein the self-segregating composition may include a concentration of the at least one self-segregating alloying element greater than the equilibrium solubility (at a certain temperature). The self-segregating composition may include or be formed from more host material than alloying element (in other words, a higher concentration of the host material than of the at least one alloying element).

By way of example, the host material may include or be formed from copper (Cu). Alternatively, the host material may include or be formed from aluminum (Al). Optionally, the self-segregating composition (e.g., its host material) may further include at least one non-metal, e.g., silicon (Si). For example, the self-segregating composition may include or be formed from AlCu or AlCuSi.

By way of example, the at least one self-segregating alloying element may include or be formed from copper. Alternatively or additionally, the at least one self-segregating alloying element may include or be formed from aluminum.

The alloying element and the host material may differ from each other in at least one of: a bulk crystal structure (e.g., in the range from about room temperature to about the segregation temperature, e.g., to about 400° C.), an atomic radius of more than about 15% (e.g., more than about 20%, 30% or 40%), an electronegativity of more than about 15% (e.g., more than about 20%, 30% or 40%). Alternatively or additionally, the self-segregating composition may include at least one of: more than one phase, an eutectic, an intermetallic phase (e.g., $CuAl_2$), and a miscibility gap.

FIG. 1 illustrates a method 100 according to various embodiments in a schematical flow diagram. The method 100 may be configured for processing an electronic component including at least one electrically conductive contact region.

The method may include in 101 forming a contact pad including or formed from a self-segregating composition. The contact pad may be formed over the at least one electrically conductive contact region to electrically contact the electronic component.

The method may further include in 103 forming a segregation suppression structure between the contact pad and the electronic component. The segregation suppression structure may include or be formed from more nucleation inducing topography features (e.g., a greater area density of nucleation inducing topography features) than the at least one electrically conductive contact region. The nucleation inducing topography features may be configured to perturb a chemical segregation of the self-segregating composition. The chemical segregation of the self-segregating composition may be perturbed by crystallographic interfaces of the contact pad defined by the nucleation inducing topography features. For example, the segregation suppression structure may include or be formed from a segregation suppression layer (e.g., from a liner), e.g., by structuring.

In other words, a chemical segregation of the self-segregating composition may be spatially limited to a crystallite size of the contact pad. The crystallite size of the contact pad may be defined by the area density of the nucleation inducing topography features.

The method may optionally include in 105 forming a passivation layer over the electronic component. The passivation layer may include at least one opening exposing the contact pad.

The method may optionally include in 107 forming a metallization on a side of the electronic component (also referred to as second side of the electronic component) opposite the contact pad (which is disposed on a first side of the electronic component). The metallization may electrically contact the electronic component or provide an electrical contact of the electronic component.

According to various embodiments, each nucleation inducing topography feature of the segregation suppression structure may be configured to induce crystallite nucleation thereon. The crystallite nucleation thereon may be configured such that at least one crystallographic interface is formed in the contact pad. For example, each crystallographic interface may be formed between adjacent nucleation inducing topography features of the segregation suppression structure. The crystallographic interface may be configured to disturb a segregation of the contact pad through the crystallographic interface.

The method may optionally include in 109 disposing at least one nucleation inducing topography feature of the segregation suppression structure between two electrically conductive contact regions of the at least one electrically conductive contact region. In other words, at least one nucleation inducing topography feature of the segregation suppression structure may be disposed between two electrically conductive contact regions of the at least one electrically conductive contact region. The at least one nucleation inducing topography feature of the segregation suppression structure may be disposed between the at least one electrically conductive contact region and the contact pad.

Alternatively or additionally, method may optionally include in 109 disposing at least one nucleation inducing topography feature of the segregation suppression structure over one electrically conductive contact region of the at least one electrically conductive contact region.

According to various embodiments, forming the contact pad may include forming a metallization and structuring the metallization. Structuring the metallization may include exposing the segregation suppression structure at least partially.

FIG. 2 illustrates a method 200 according to various embodiments in a schematical flow diagram.

The method 200 may be configured for processing an electronic component including at least one electrically conductive contact region.

The method may include in 201 forming a metallization including a self-segregating composition. The metallization may be formed over the at least one electrically conductive contact region to electrically contact the electronic component.

The method may further include in 203 forming a segregation suppression structure between the metallization and the electronic component.

The segregation suppression structure may include or be formed from more nucleation inducing topography features (e.g., a greater area density of nucleation inducing topography features) than the at least one electrically conductive contact region. The nucleation inducing topography features may be configured to perturb a chemical segregation of the self-segregating composition. The chemical segregation of the self-segregating composition may be perturbed by crystallographic interfaces of the metallization defined by the nucleation inducing topography features. In other words, a chemical segregation of the self-segregating composition may be spatially limited to a crystallite size of the metallization. The crystallite size of the metallization may be defined by the area density of the nucleation inducing topography features.

The method may optionally include in 205 forming a passivation layer over the electronic component. The passivation layer may include at least one opening exposing the metallization.

The method may optionally include in 207 forming a metallization on a side of the electronic component (also referred to as second side of the electronic component) opposite of the metallization (which is disposed on a first side of the electronic component). The metallization may electrically contact the electronic component or provide an electrical contact of the electronic component.

According to various embodiments, each nucleation inducing topography feature of the segregation suppression structure may be configured to induce crystallite nucleation thereon. The crystallite nucleation thereon may be configured such that a crystallographic interface is formed in the metallization. The crystallographic interface may be formed between adjacent nucleation inducing topography features of the segregation suppression structure. The crystallographic interface may be configured to disturb a segregation of the metallization through the crystallographic interface.

The method may optionally include in 209 disposing at least one nucleation inducing topography feature of the segregation suppression structure between two electrically conductive contact regions of the at least one electrically conductive contact region. In other words, at least one nucleation inducing topography feature of the segregation suppression structure may be disposed between two electrically conductive contact regions of the at least one electrically conductive contact region. The at least one nucleation inducing topography feature of the segregation suppression structure may be disposed between the at least one electrically conductive contact region and the metallization.

Alternatively or additionally, method may optionally include in 109 disposing at least one nucleation inducing topography feature of the segregation suppression structure over one electrically conductive contact region of the at least one electrically conductive contact region.

Optionally, the method may include structuring the metallization to form at least one contact pad. Structuring the metallization may include exposing the segregation suppression structure at least partially.

FIG. 3 illustrates a method 300 according to various embodiments in a schematical flow diagram. The method 300 may be configured for processing an electronic component including at least one electrically conductive contact region. The method may include in 301 forming a metallization including an aluminum bronze. The aluminum bronze may include or be formed from aluminum and copper (e.g., an aluminum-copper alloy). The metallization may be formed over the at least one electrically conductive contact region to electrically contact the electronic component.

The method may further include in 303 forming a segregation suppression structure between the metallization and the electronic component.

The segregation suppression structure may include or be formed from more protrusions (e.g., a greater area density of protrusions) than the at least one electrically conductive contact region. The protrusions (also referred to as nucleation inducing protrusions) may be configured to perturb a chemical segregation of the aluminum bronze. The chemical segregation of the aluminum bronze may be perturbed by crystallographic interfaces of the metallization induced by the protrusions. In other words, a chemical segregation of the aluminum bronze may be spatially limited to a crystallite size of the metallization. The crystallite size of the metallization may be defined by the area density of the protrusions.

The method may optionally include in 305 forming a passivation layer over the electronic component. The passivation layer may include at least one opening exposing the metallization.

The method may optionally include in 307 forming a metallization on an side of the electronic component (also referred to as second side of the electronic component) opposite the metallization (which is disposed on a first side of the electronic component). The metallization may electrically contact the electronic component or provide an electrical contact of the electronic component.

According to various embodiments, each protrusion of the segregation suppression structure may be configured to induce crystallite nucleation thereon. The crystallite nucleation thereon may be configured such that a crystallographic interface is formed in the metallization. The crystallographic interface may be formed between adjacent protrusions of the segregation suppression structure. The crystallographic interface may be configured to disturb a segregation of the metallization through the crystallographic interface.

The method may optionally include in 309 disposing at least one protrusion of the segregation suppression structure between two electrically conductive contact regions of the at least one electrically conductive contact region. In other words, at least one protrusion of the segregation suppression structure may be disposed between two electrically conductive contact regions of the at least one electrically conductive contact region. The at least one protrusions of the segregation suppression structure may be disposed between the at least one electrically conductive contact region and the metallization.

Alternatively or additionally, method may optionally include in 109 disposing at least one protrusion of the segregation suppression structure over one electrically conductive contact region of the at least one electrically conductive contact region.

Optionally, the method may include structuring the metallization to form at least one contact pad (in other words, one or more contact pads). Structuring the metallization may include exposing the segregation suppression structure at least partially.

FIG. 4A to FIG. 4D respectively illustrate an electronic component in a method according to various embodiments in a schematical cross sectional view or side view (e.g., along a macroscopic surface normal 404n of the electrically conductive contact region 402).

The electronic component may include in 400a at least one electrically conductive contact region 402. According to various embodiments, the electrically conductive contact region may include a metal, e.g., nickel and/or aluminum, e.g., an alloy therefrom. Alternatively or additionally, the electrically conductive contact region 402 may include at least one doped semiconductor region (also referred to as doped region), e.g., embedded in a less doped further semiconductor region.

The electronic component may include in 400b a segregation suppression structure 404. The segregation suppression structure 404 may be formed over the electrically conductive contact region 402.

The segregation suppression structure 404 may include or be formed from at least one nucleation inducing topography feature 404f (also referred to as topography feature 404f). Each nucleation inducing topography feature 404f of the segregation suppression structure 404 may include or be formed from at least one type of the following nucleation inducing topography features 404p: a recess; a protrusion, an edge.

The segregation suppression structure 404 may include or be formed more nucleation inducing topography features 404p than the at least one electrically conductive contact region 402 (e.g., referring to one type of nucleation inducing topography features 404p). For example, the segregation suppression structure 404 may include or be formed from more recesses than the at least one electrically conductive contact region 402. Alternatively or additionally, the segregation suppression structure 404 may include or be formed from more protrusions than the at least one electrically conductive contact region 402. For example, at least one of each protrusion and each recess may include at least one edge, such that the segregation suppression structure 404 may include or be formed more edges than the at least one electrically conductive contact region 402.

The electronic component may include in 400c a metallization 406 (also referred to as metallization layer) formed over the at least one electrically conductive contact region 402 to electrically contact the electronic component. By way of example, the metallization 406 may include or be formed from a power metallization 406. The metallization 406 may include or be formed from a self-segregating composition. A physical vapor deposition (e.g., sputtering) may be used for forming the metallization 406.

The self-segregating composition may include or be formed from a host material and an alloying element (self-segregating alloying element). The alloying element may include or be formed from a first metal. Alternatively or additionally, the alloying element may include or be formed from a second metal, e.g., different than the first metal. The self-segregating composition may include at least two metals, e.g., an alloy including the at least two metals, the first metal and the second metal. For example, the at least two metals may include or be formed from at least one of a noble half metal (e.g., copper) and a base metal (e.g., aluminum). The self-segregating composition (also referred to as noble-base composition) may be disposed stoichiometric (e.g., in a homogeneous relation of the first metal and the second metal), e.g., spatially homogeneous.

According to various embodiments, the at least two metals (e.g., the first metal and the second metal) may differ from each other in the sign (positive or negative) of their standard electrode potential. In other words, the first metal may be a noble metal (corresponding to a positive standard electrode potential) and the second metal may be a base metal (corresponding to a negative standard electrode potential) or vice versa. For example, the first metal may be one from the following group of noble metals: Gold, Platinum, Iridium, Palladium, Osmium, Silver, Mercury, Rhodium, Copper, and/or Bismuth. Alternatively or additionally, the second metal may be one from the following group of base metals: Aluminum, Zinc, Tin, Gallium, Germanium, iron, Cobalt, Chromium, Nickel, Indium, Titanium, Tungsten, and/or Magnesium.

According to various embodiments, the standard electrode potential of a chemical element (such as a metal) may be understood in accordance with the galvanic series (also referred to as electropotential series). The standard electrode potential may denote the electric potential difference between an electrode made from the chemical element and a reference electrode, e.g., in a standard galvanic cell at standard state, e.g., at standard conditions for temperature and pressure (298.15 Kelvin and 100 Kilopascal). The standard galvanic cell may include the electrode and the reference electrode (e.g., a standard hydrogen electrode). In other words, the standard electrode potential is given with regard to a reference potential (e.g., provided by the reference electrode, e.g., standard hydrogen potential), which may be zero. In the galvanic cell, electricity is generated due to electric potential difference between the two electrodes. This potential difference is created as a result of the difference between individual potentials of the two electrodes with respect to the electrolyte of the standard galvanic cell. In standard state of the standard galvanic cell, the electrolyte may have a pH value of about 0 and an ion activity of about 1. The standard electrode potential may be also referred to as standard reduction potential.

Alternatively or additionally, the at least two metals (e.g., the first metal and the second metal) may differ from each other in their electronegativity (e.g., according to the Pauling-scale), e.g., by more than or equal to about 0.1, e.g., by more than or equal to about 0.2, preferably by more than or equal to about 0.3, e.g., by more than or equal to about 0.4, e.g., by more than or equal to about 0.5, e.g., by more than or equal to about 0.6. For example, the first metal may have an electronegativity of more than or equal to about 1.8, e.g., more than or equal to about 1.9. Alternatively or additionally, the second metal may have an electronegativity of less than or equal to about 1.7, e.g., less than or equal to about 1.61.

During forming the metallization 406, a plurality of crystallites 406c may be formed (also referred to as nucleation). By way of example, the crystallite nucleation may be enhanced (e.g., induced) by the nucleation inducing topography features 404f of the segregation suppression structure 404, e.g., in the recesses of the segregation suppression structure 404. Each nucleation inducing topography feature 404f of the segregation suppression structure 404 may be configured to induce crystallite nucleation thereon.

The density (e.g., area density) of the nucleation inducing topography features 404f of the segregation suppression structure 404 may define a density (e.g., area density) of crystallites 406c of the metallization 406. During growth, the adjacent crystallites 406c may adjoin each other by forming a crystallographic interface 406i of the metallization 406, as schematically illustrated in 400d. In other words, each nucleation inducing topography feature 404f of the segregation suppression structure 404 may be configured to induce at least one crystallographic interfaces 406i of the metallization 406. The density (e.g., area density) of the nucleation inducing topography features 404f of the segregation suppression structure 404 may define a density (e.g., area density) of crystallographic interfaces 406i of the metallization 406. The distance of crystallographic interfaces 406i of the metallization 406 may decrease with a higher area density (number per area) of the crystallographic interfaces 406i of the metallization 406. The crystallite size of the metallization 406 (in other words, the distance of crystallographic interfaces 406i) may be defined by the density of the nucleation inducing topography features 404f.

Each crystallographic interface 406i may be formed at least one of over each nucleation inducing topography feature and between adjacent nucleation inducing topography features 404f of the segregation suppression structure 404. The crystallographic interfaces 406i of the metallization 406 may be configured to perturb a chemical segregation of the self-segregating composition. Illustratively, the chemical segregation of the self-segregating composition may stop at the crystallographic interfaces 406i of the metallization 406.

According to various embodiments, a thickness 406t of the metallization 406 may be greater than a thickness 404t of the segregation suppression structure 404, e.g., greater than about ten times the thickness 404t of the segregation suppression structure 404, e.g., greater than about twenty times the thickness 404t of the segregation suppression structure 404, e.g., greater than about thirty times the thickness 404t of the segregation suppression structure 404, e.g., greater than about fifty times the thickness 404t of the segregation suppression structure 404, e.g., greater than about hundred times a thickness 404t of the segregation suppression structure 404.

The crystallites 406c of the metallization 406 may grow column-like. For example, the extension of each crystallite 406c of the metallization 406 in a direction perpendicular to a macroscopic surface plane 404p of the at least one electrically conductive contact region 402 may be greater than a distance between two other crystallites 406c of the metallization 406 adjoining the crystallite 406c of the metallization 406. Alternatively or additionally, the extension of each crystallite 406c of the metallization 406 in a direction perpendicular to the macroscopic surface plane 404p may be greater than an extension of the crystallite 406c of the metallization 406 parallel to the macroscopic surface plane 404p. A macroscopic surface normal 404n of the electrically conductive contact region 402 may be perpendicular to the macroscopic surface plane 404p of the electrically conductive contact region 402. The macroscopic surface plane 404p may be disposed and aligned such, that it includes a maximum number of points of (or a respective maximum intersection with) a surface 402s of the electrically conductive contact region 402 over which the segregation suppression structure 404 is disposed.

Figure 5A:
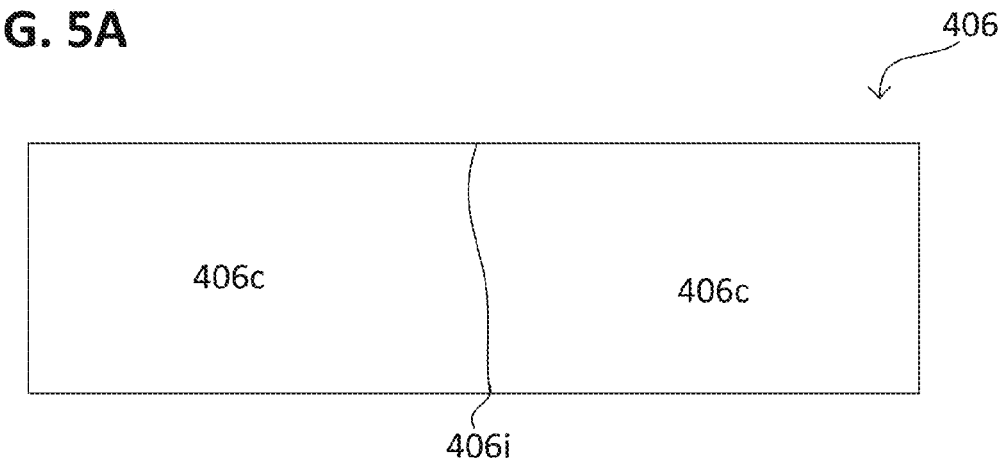
FIG. 5A and FIG. 5B respectively show a metallization in a method according to various embodiments in a schematical cross sectional view or side view.

FIG. 5A illustrates a metallization 406 in a method according to various embodiments in a schematical cross sectional view or side view (e.g., along a macroscopic surface normal 404n of the electrically conductive contact region 402).

The metallization 406 may include or be formed from a plurality of crystallites 406c. Adjacent crystallites of the plurality of crystallites 406c may adjoin each other in a crystallographic interface 406i.

According to various embodiments, the metallization 406 may include or be formed from at least one contact pad. For example, the metallization 406 (e.g., the at least one contact pad) may be configured to be contacted further by at least one of bonding or soldering.

Figure 5B:
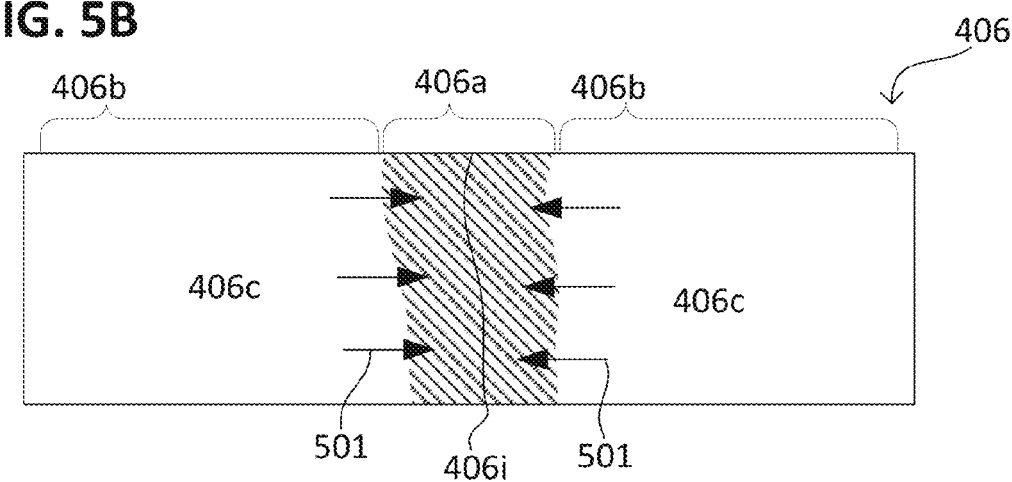

FIG. 5B illustrates a metallization 406 in a method according to various embodiments in a schematical cross sectional view or side view (e.g., along a macroscopic surface normal 404n of the electrically conductive contact region 402).

In a further process step, the metallization 406 may be heated. For example, the further process step may include or be formed from at least one of: soldering, bonding, plasma cleaning, packaging, etc.

In the further process step, a segregation of the metallization 406 may be activated (e.g., of its self-segregating composition), e.g., by the heating. By the segregation of the metallization 406 (e.g., of its self-segregating composition) a concentration of the alloying element proximate the crystallographic interface 406i may be increased. For example, the alloying element of the self-segregating composition may migrate 501 (e.g., diffuse) towards the crystallographic interfaces 406i of the metallization 406 during the segregation. The alloying element may enrich at the crystallographic interfaces 406i of the metallization 406. Due to the equilibrium formed at the crystallographic interfaces 406i, the alloying element may not pass through the crystallographic interfaces 406i. Therefore, the chemical segregation of the self-segregating composition (e.g., the compositional variation therefrom) may be spatially limited to a crystallite size of the metallization 406.

Activating the segregation may include activating a migration 401 of the alloying element towards the crystallographic interface 406i. By the segregation of the metallization 406 (e.g., of its self-segregating composition) a first region 406a proximate the crystallographic interface 406i and a second region 406b distant from the crystallographic interface 406i may be formed. For example, in each crystallite of the plurality of crystallites 406c at least one first region 406a and at least one second region 406b may be formed. The at least one first region 406a may at least partially surround the at least one second region 406b. Alternatively or additionally, the at least one first region 406a may be disposed between the at least one second region 406b and the crystallographic interface 406i.

Activating the segregation may include reducing a concentration (e.g., spatially averaged) of the alloying element in the second region 406b (e.g., in other words, deplete the alloying element in the second region 406b). Alternatively or additionally, activating the segregation may include enriching the alloying element in the first region 406a. In other words, the second region 406b may be a depletion region 406b for the alloying element. Alternatively or additionally, the first region 406a may be a depletion region 406b for the host material.

Activating the segregation may include or be formed from heating the metallization 406 above the segregation temperature. Above the segregation temperature, the equilibrium solubility of the alloying element in the host material may be exceeded and/or a miscibility gap of the alloying element in the host material may be entered.

At least one of during and after the segregation, the concentration of the alloying element in the at least one first region 406a may be greater than in the at least one second region 406b. The crystallographic interface 406i may be configured to reduce or avoid a segregation of the metallization 406 through the crystallographic interface 406i.

Figure 5C:
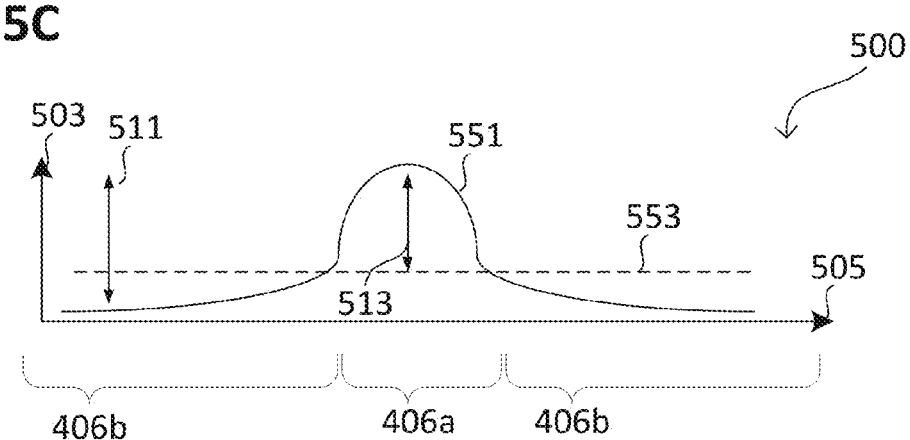
FIG. 5C shows a schematic diagram in a method according to various embodiments.
Figure 6A:
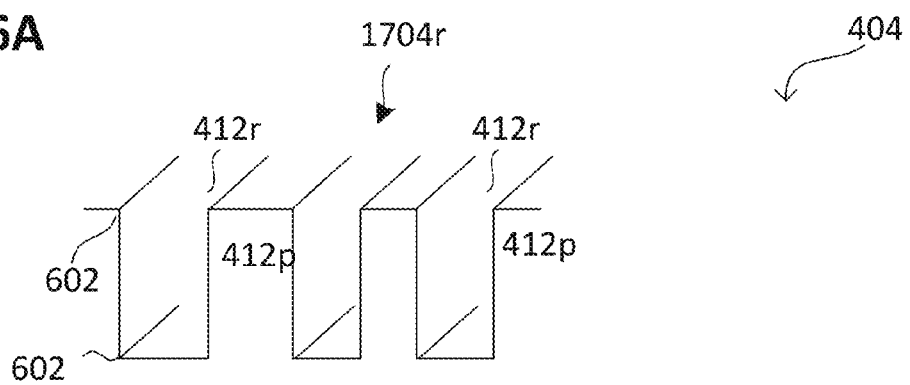
FIG. 6A to FIG. 6D respectively show a segregation suppression structure in a method according to various embodiments in a schematical perspective view.
Figure 6B:
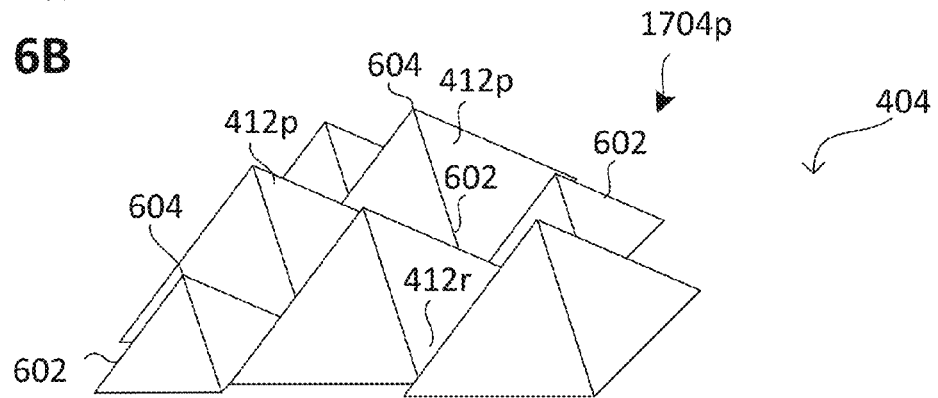
Figure 6C:
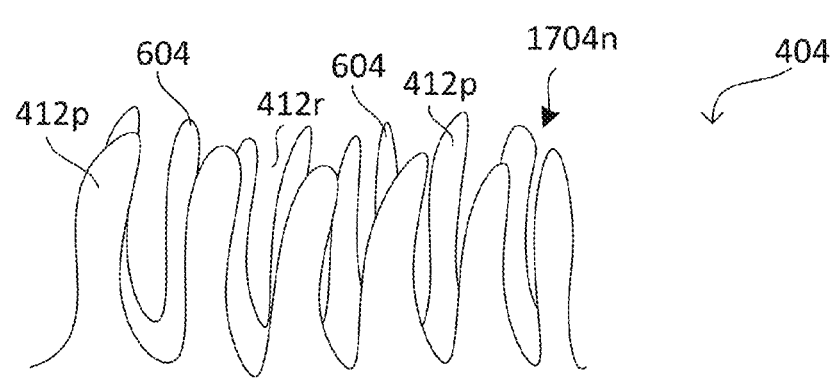
Figure 6D:
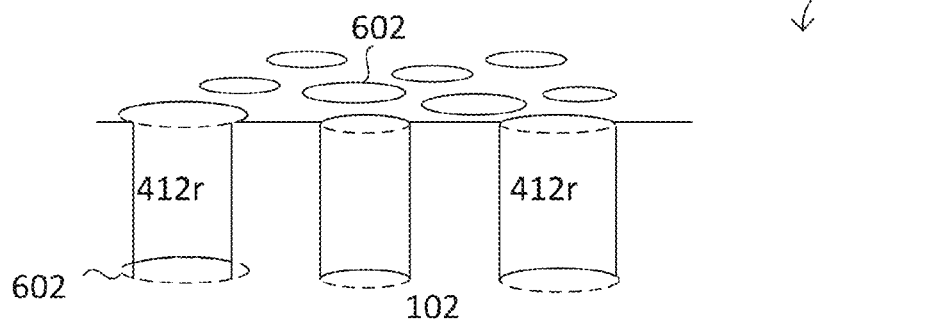

FIG. 5C illustrates a schematic diagram 500 in a method according to various embodiments.

In the schematic diagram 500 a concentration 503 (e.g., an atomic concentration) is illustrated over a vertical position 505 in the metallization 406 (e.g., along a macroscopic surface normal 404n of the electrically conductive contact region 402). Line 553 represents a spatially distributed concentration of the alloying element before activating the segregation. The spatially distributed concentration 553 of the alloying element before activating the segregation may be equal to a spatially averaged concentration 553 of the alloying element in the metallization layer 406. In other words, spatially concentration 553 of the alloying element before activating the segregation may be homogeneously distributed.

Line 551 represents a spatially distributed concentration of the alloying element at least one of during and after activating the segregation. The concentration 503 of the alloying element in the first region 406a may be greater than a concentration 503 of the alloying element in the second region 406b. Alternatively or additionally, the concentration 503 of the alloying element in the first region 406a may be greater than the spatially averaged concentration 553 of the alloying element in the metallization layer 406.

A concentration (first concentration, e.g., spatially averaged) of the alloying element in the second region 406b (e.g., in the self-segregating composition) before the activating the segregation may be greater than a concentration (second concentration, e.g., spatially averaged) of the alloying element in the second region 406b (e.g., in the self-segregating composition) after the activating the segregation. Alternatively or additionally, at least one of the first concentration or the second concentration may be less than a concentration (third concentration, e.g., spatially averaged) of the alloying element in the first region 406a after the activating the segregation.

The first concentration (e.g., spatially averaged) may be in the range from about 0.5 atomic percent (at %) to about 50 at %, e.g., in the range from about 1 at % to about 40 at %, e.g., in the range from about 2 at % to about 30 at %, e.g., in the range from about 5 at % to about 25 at %, e.g., in the range from about 5 at % to about 20 at %, e.g., about 10 at %.

Alternatively or additionally, an amount of the self-segregating composition in the metallization layer 406 may be greater than about 70 at %, e.g., greater than about 80 at %, e.g., greater than about 90 at %, e.g., greater than about 95 at %, e.g., greater than about 99 at %, e.g., about 100 at %. In other words, the metallization layer 406 may be substantially formed from the self-segregating composition.

The second concentration (e.g., spatially averaged) may be less than about 50 at %, e.g., less than about 40 at %, e.g., less than about 30 at %, e.g., less than about 20 at %, e.g., less than about 10 at %, e.g., less than about 5 at %, e.g., less than about 2 at %, e.g., less than about 0.5 at %, e.g., less than about 0.1 at %.

The third concentration (e.g., spatially averaged) may be greater than about 50 at %, e.g., greater than about 60 at %, e.g., greater than about 70 at %, e.g., greater than about 80 at %, e.g., greater than about 90 at %, e.g., greater than about 95 at %, e.g., greater than about 99 at %, e.g., about 100 at %. In other words, the first region 406a may be substantially formed from the alloying element after the activating the segregation.

Alternatively or additionally, the first region 406a may be substantially formed from a compound (also referred to as intermetallic phase) including the alloying element and the host element. For example, the first region 406a may include or be formed from a binary metallic compound of the self-segregating composition, e.g., $CuAl_2$.

The alloying element may include or be formed from at least one of: manganese, tantalum, chromium, tungsten, copper and/or molybdenum. By way of example, the alloying element may be copper. Alternatively, the host material may include or be formed from at least one of aluminum, silicon and nickel.

According to various embodiments, activating the segregation may include forming a concentration gradient of the alloying element in each crystallite 406c of the metallization 406 pointing into the direction of the crystallographic interface 406i.

According to various embodiments, at least one of the alloying element or the self-segregating composition may be configured such that a segregation of the alloying element from the metallization 406 (e.g., from the host material) starts at a lower temperature than a reaction of the metallization 406 (e.g., of the host material) with the at least one electrically conductive contact region 402, e.g., with a material (e.g., at least one of a metal or a semiconductor) of the at least one electrically conductive contact region 402. In other words, a temperature activating a segregation (also referred to as segregation temperature) of the alloying element from the metallization 406 may be less than a temperature activating a reaction (also referred to as reaction temperature) of the metallization 406 (e.g., the host material) with the at least one electrically conductive contact region 402 (e.g., its material).

The segregation temperature may be less than about 400° C., e.g., less than about 350° C., e.g., less than about 300° C., e.g., less than about 250° C., e.g., less than about 200° C., e.g., less than about 190° C., e.g., less than about 180° C., e.g., less than about 170° C., e.g., less than about 160° C., e.g., less than about 150° C., alternatively or additionally (and/or), more than about room temperature, e.g., more than about 100° C.

According to various embodiments, the method may include heating the metallization 406 to a temperature greater than the segregation temperature to activate the segregation of the alloying element from the metallization 406 (e.g., from the host material).

Illustratively, the smaller a grain size or distance of the crystallographic interfaces is, the less is the total variation 511 of the concentration 551 of the alloying element in the metallization layer 406 (and the respective deviation 513 from the spatially averaged concentration 553 of the alloying element in the metallization layer 406). According to various embodiments, the deviation 513 from the spatially averaged concentration 553 of the alloying element in the metallization layer 406 (also referred to as reference concentration 553) may be less than about 50 at % of the reference concentration 553, e.g., less than about 40 at % of the reference concentration 553, e.g., less than about 30 at % of the reference concentration 553, e.g., less than about 20 at % of the reference concentration 553, e.g., less than about 10 at % of the reference concentration 553, e.g., less than about 5 at % of the reference concentration 553, e.g., less than about 2 at % of the reference concentration 553, e.g., less than about 0.5 at % of the reference concentration 553, e.g., less than about 0.1 at % of the reference concentration 553.

FIG. 6A to FIG. 6D respectively illustrate segregation suppression structure 404 in a method according to various embodiments in a schematical perspective view.

According to various embodiments, the segregation suppression structure 404 may include a plurality of nucleation inducing topography feature 404f having various geometries. For example, the segregation suppression structure 404 may include a rough surface (e.g., formed by rough etching, e.g., using plasma etching). Alternatively or additionally, the segregation suppression structure 404 may include or be formed from at least one type selected from the following types of segregation suppression structures: a trench structure 1704r, a pyramid structure 1704p, a needle structure 1704n, and/or a hole structure 1704h.

The trench structure 1704r may include or be formed from a plurality of protrusions 412p separated from each other by a plurality of recesses 412r. Each recess of the plurality of recesses 412r may be form of a trench (plurality of trenches 412r). At least one of each protrusions of the plurality of protrusions 412p and each recess of the plurality of recesses 412r may provide a topography feature. Each trench of the plurality of trenches 412r may be extended in a direction parallel to a macroscopic surface normal 404n of the electrically conductive contact region 402. The extension of the plurality of trenches 412r in a direction parallel to the macroscopic surface normal 404n may be greater than at least one of a distance between them or an extension of them parallel to the macroscopic surface normal 404n. In other words, the trenches of the plurality of trenches 412r may be elongated. Optionally, each protrusion of the plurality of protrusions 412p may be tapered. Alternatively or additionally, each protrusion of the plurality of protrusions 412p may be facetted. The plurality of trenches 412r may be formed using etching, ablating (e.g., by laser ablation) or sawing.

The pyramid structure 1704p may include or be formed from a plurality of protrusions in form of pyramids, also referred to as plurality of pyramids 412p. Each pyramid of the plurality of pyramids 412p may be tapered. Alternatively or additionally, each pyramid of the plurality of pyramids 412p may be facetted. At least one of each pyramid of the plurality of pyramid 412p and each recess between them may provide a topography feature. The plurality of pyramids 412p may be formed by anisotropic etching or ablation (e.g., by laser ablation).

The needle structure 1704n may include or be formed from a plurality of protrusions 412p in needle form (plurality of needles 412p) disposed distant from each other. For example, the needle structure 1704n may be formed by reactive ion etching. Each needle of the plurality of needles 412p may be extended in a direction perpendicular to the macroscopic surface normal 404n. The extension of the needles of the plurality of needles 412p may be greater than at least one of a distance between them or an extension of them parallel to the macroscopic surface normal 404n. In other words, the needles of the plurality of needles 412p may be elongated. Optionally, each needle of the plurality of needles 412p may be tapered. Alternatively or additionally, each needle of the plurality of needles 412p may be facetted. At least one of each needle of the plurality of needles 412p and each recess between them may provide a topography feature.

The hole structure 1704h may include or be formed from a plurality of recesses 412r in form of holes, also referred to as plurality of holes 412r. Each hole of the plurality of holes 412r may extend into or through the segregation suppression structure 404, wherein the plurality of holes 412r may be separated from each other. The extension of the holes of the plurality of holes 412r into the segregation suppression structure 404 may be greater than at least one of their extension parallel to the macroscopic surface normal 404n, or their distance to each other. Optionally, each hole of the plurality of holes 412r may be tapered. Alternatively or additionally, each hole of the plurality of holes 412r may be facetted. Each hole of the plurality of holes 412r may provide a topography feature.

According to various embodiments, various other types of the at least one nucleation inducing topography feature 404f (in other words, one or more than one nucleation inducing topography features 404f) may be provided, for example, at least one of: an island, a line, and a hexagon. The more than one nucleation inducing topography feature 404f may be arranged regular, e.g., in a grid (including at least one nucleation inducing topography feature 404f which has equal distance to all adjacent nucleation inducing topography features 404f).

Optionally, each topography feature may include or be formed from at least one of an edge 602 and a tip 604.

Figure 7A:
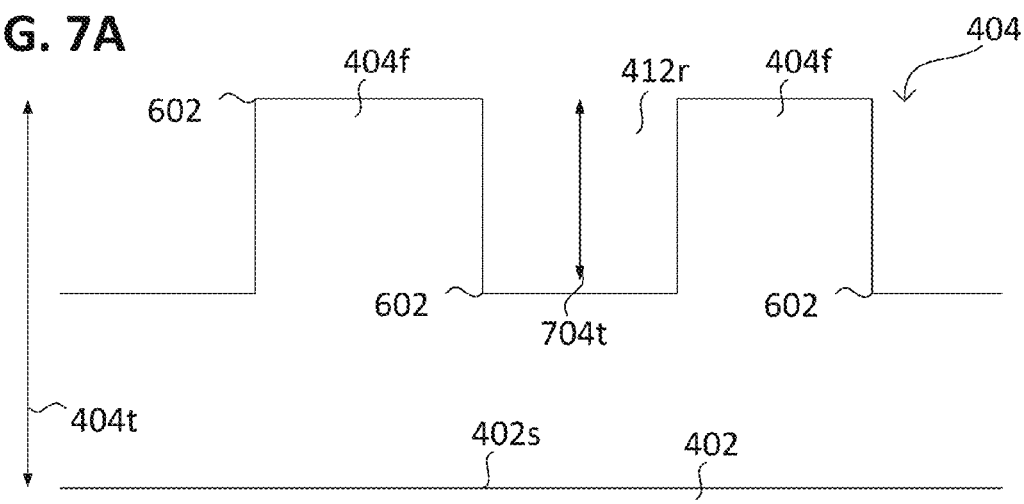
FIG. 7A and FIG. 7B respectively show a segregation suppression structure in a method according to various embodiments in a schematical cross sectional view or side view.
Figure 7B:
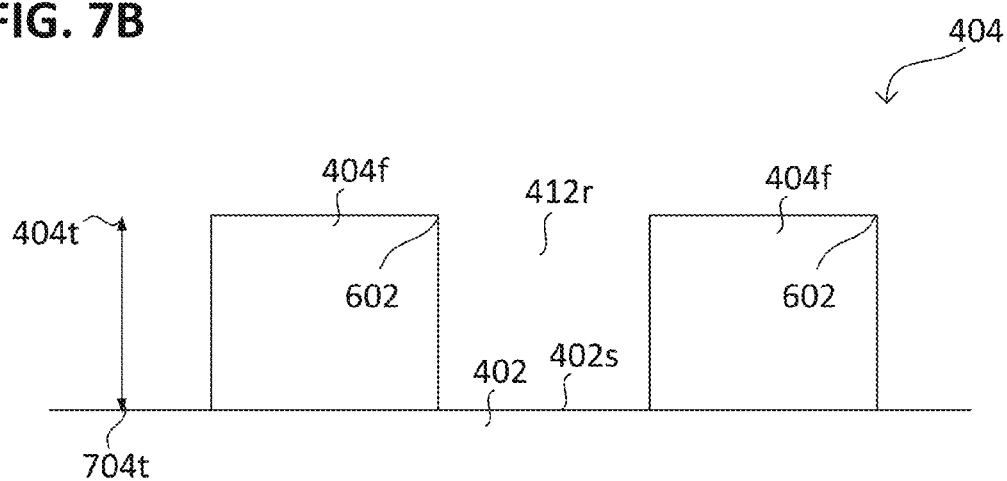

FIG. 7A and FIG. 7B respectively illustrate segregation suppression structure 404 in a method according to various embodiments in a schematical cross sectional view or side view (e.g., along a macroscopic surface normal 404n of the electrically conductive contact region 402).

According to various embodiments, the segregation suppression structure 404 may include a segregation suppression layer (e.g., a metallization) covering the electrically conductive contact region 402. The nucleation inducing topography features 404f (e.g., recesses 412r) may extend into the segregation suppression layer. Alternatively or additionally, the nucleation inducing topography features 404f may protrude from the segregation suppression layer, as illustrated in FIG. 7A.

Alternatively or additionally, the segregation suppression structure 404 may include at least one recess 404r partially exposing the electrically conductive contact region 402, as illustrated in FIG. 7B. The nucleation inducing topography features 404f may at least one of extend through the segregation suppression layer and protrude from the at least one electrically conductive contact region 402, as illustrated in FIG. 7B.

A thickness 404t of the segregation suppression structure 404 may be greater than or equal to a height 704t of each nucleation inducing topography feature 404f (in other words, one or more than one nucleation inducing topography features 404f). The height 704t of the at least one nucleation inducing topography feature 404f (e.g., to fulfill a nucleation inducing height criterion) may be in the range from about 1 nanometer (nm) to about 100 nm, e.g., in the range from about 10 nm to about 50 nm. For example, the height 704t of the at least one nucleation inducing topography feature 404f may be greater than about 25 nm, e.g., greater than about 50 nm, and/or less than about 100 nm, e.g., less than about 75 nm.

According to various embodiments, the thickness 404t of the segregation suppression structure 404 may be in the range from about 50 nm to about 500 micrometer (µm), e.g., greater than about 100 nm, e.g., greater than about 100 µm, and/or less than about 50 µm, e.g., in the range from about 10 µm to about 50 µm or less than about 10 µm.

Figure 8A:
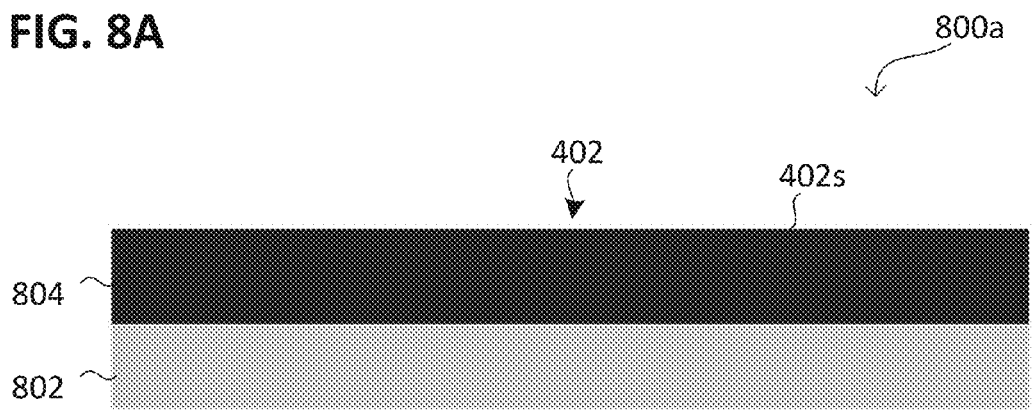
FIG. 8A to FIG. 8C respectively show an electronic component in a method according to various embodiments in a schematical cross sectional view or side view.
Figure 8B:
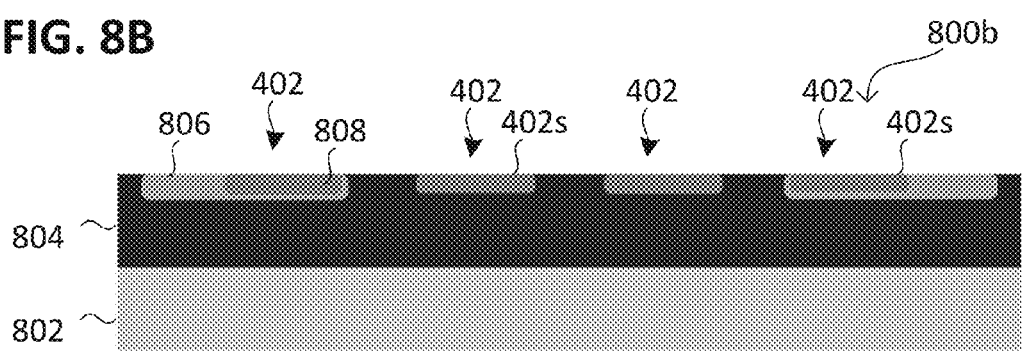
Figure 8C:
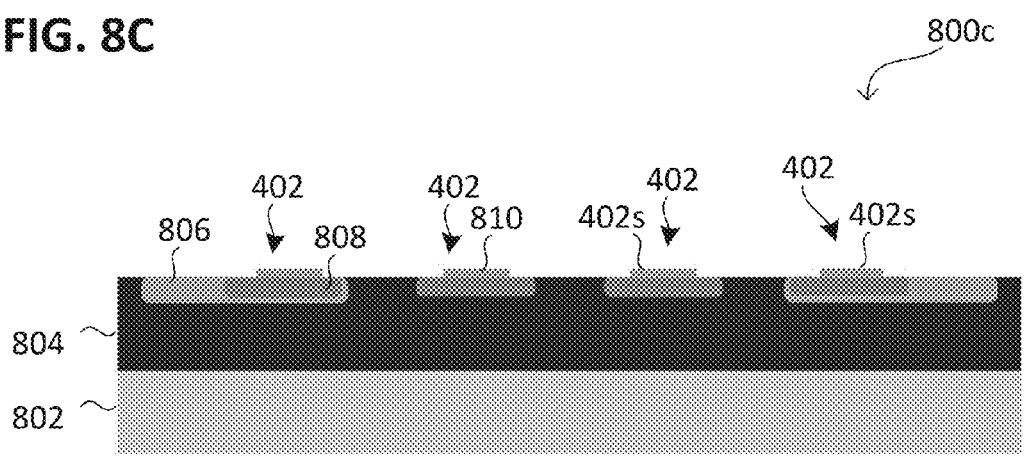

FIG. 8A to FIG. 8C respectively illustrate an electronic component in a method according to various embodiments in a schematical cross sectional view or side view (e.g., along a macroscopic surface normal 404n of the electrically conductive contact region 402).

The electronic component 800a may include or be formed from at least one semiconductor region 802, 804. The at least one semiconductor region 802, 804 may include or be formed from a first semiconductor region 802 and optional a second semiconductor region 804. The second semiconductor region 804 may be optionally formed by epitaxial growth on the first semiconductor region 802. The at least one semiconductor region 802, 804 may be doped, e.g., by a first doping type (e.g., n-type doped)

The first semiconductor region 802 may include or be formed from a wafer (also referred to as substrate). The first semiconductor region 802 may include or be formed from a first semiconductor material, e.g., at least one of silicon and a silicon compound (e.g., silicon carbide). A thickness of first semiconductor region 802 may be in the range from about to about 100 µm to about 500 µm, e.g., about 350 µm. The second semiconductor region 804 may include or be formed from an epitaxial layer. The second semiconductor region 804 may include or be formed from a second semiconductor material, e.g., the same as the first semiconductor material), e.g., at least one of silicon and a silicon compound (e.g., silicon carbide).

The first semiconductor region 802 or, if present, the second semiconductor region 804 may include or be formed from an electrically conductive contact region 402 of the electronic component 800a.

The electronic component 800b may include at least one further semiconductor region 806, 808. The at least one further semiconductor region 806, 808 may include or be formed from at least one of a first further semiconductor region 806 and a second further semiconductor region 808. The at least one further semiconductor region 806, 808 may be doped, e.g., by a second doping type (e.g., p-type doped). The second doping type may be opposite the first doping type. The first further semiconductor region 806 may be doped less than the second further semiconductor region 808 (in other words, include a smaller doping concentration). By way of example, the dopant of the second doping type (also referred to as second dopant) may include or be formed from a metal, e.g., aluminum.

The at least one further semiconductor region 806, 808 may be formed by implanting (e.g., by ion implantation) a dopant of the second doping type into the first semiconductor region 802 or, if present, the second semiconductor region 804. Each further semiconductor region 806, 808 may include or be formed from an electrically conductive contact region 402 of the electronic component 800a.

The electronic component 800c may include at least one ohmic contact region 810. The at least one electrically conductive contact region 810 may include an ohmic characteristic (e.g., an ohmic current-voltage characteristic). The ohmic characteristic may represent a linear correlation between the electrical current and the electrical voltage. The at least one ohmic contact region 810 may include or be formed from a metal (e.g., aluminum), e.g., the same as the second dopant. Alternatively or additionally, the at least one ohmic contact region 810 may include or be formed from a metal alloy including at least two metals, e.g., at least one of nickel and aluminum.

Each ohmic contact region 810 may include or be formed from an electrically conductive contact region 402 of the electronic component 800a. Each ohmic contact region 810 may be in electrical contact with the underlying semiconductor region 804, 802, 806, 808, e.g., at least one of the further semiconductor region 806, 808 and the at least one semiconductor region 804, 802. By way of example, each ohmic contact region 810 may protrude from the underlying semiconductor region, e.g., at least one of the further semiconductor region 806, 808 and the semiconductor region 804, 802, 806, 808.

The material of the at least one ohmic contact region 810 may be at least partially (in other words, partially or completely) alloyed with the underlying semiconductor region 804, 802, 806, 808. For example, at least one metal of the ohmic contact region 810 may migrate (e.g. diffuse) into the underlying semiconductor region 804, 802, 806, 808, e.g., by thermal activation, for doping the underlying semiconductor region 804, 802, 806, 808.

By way of example, the electronic component 800b, 800c may include or be formed from a shottky diode.

Figure 9A:
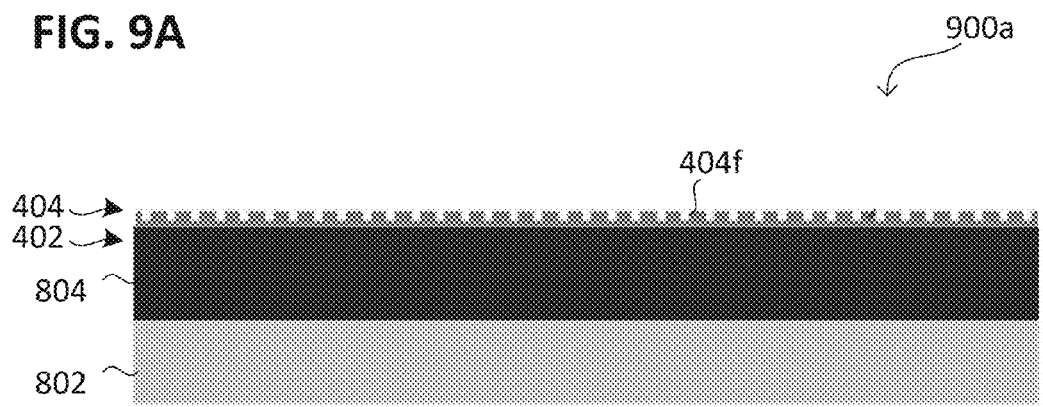
FIG. 9A to FIG. 9C respectively show an electronic component in a method according to various embodiments in a schematical cross sectional view or side view.
Figure 9B:
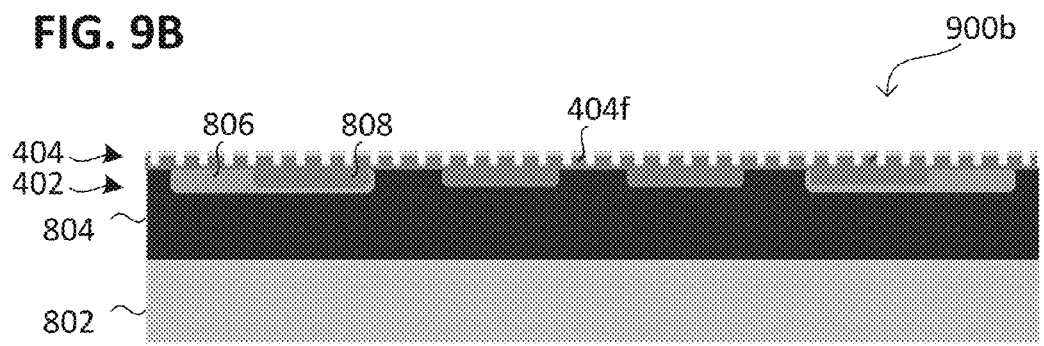
Figure 9C:
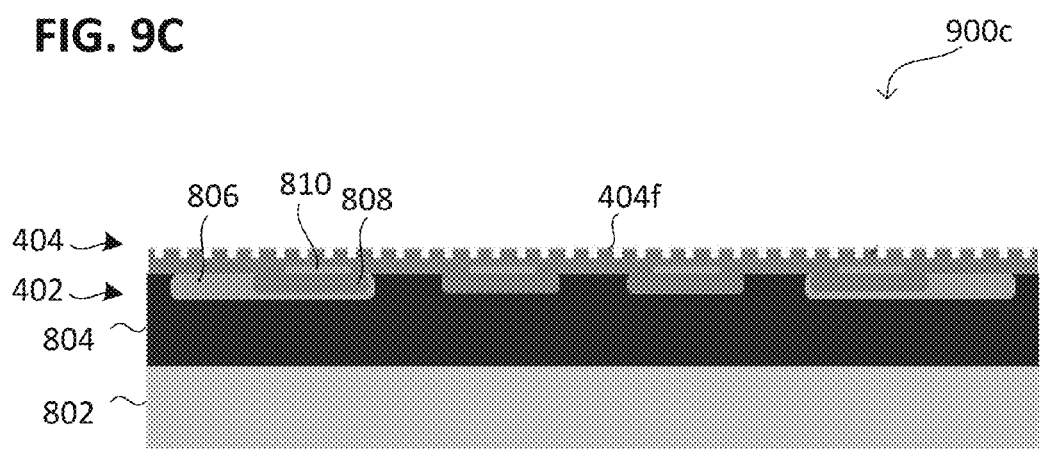

FIG. 9A to FIG. 9C respectively illustrate an electronic component in a method according to various embodiments in a schematical cross sectional view or side view (e.g., along a macroscopic surface normal 404n of the electrically conductive contact region 402).

The electronic component 900a may be similar to the electronic components 800a, wherein a segregation suppression structure 404 may be formed over the first semiconductor region 802 and, if present, over the second semiconductor region 804. The segregation suppression structure 404 may include more nucleation inducing topography features 404f than the underlying at least one semiconductor region 802, 804 (e.g., than the first semiconductor region 802 or, if present, than the second semiconductor region 804). By way of example, the segregation suppression structure 404 may include more edges than the underlying semiconductor region 802, 804. Alternatively or additionally, the segregation suppression structure 404 may include more recesses than the underlying semiconductor region 802, 804. Alternatively or additionally, the segregation suppression structure 404 may include more protrusions than the underlying semiconductor region 802, 804.

The electronic component 900b may be similar to the electronic components 800b, wherein a segregation suppression structure 404 may be formed over the at least one further semiconductor region 806, 808. The segregation suppression structure 404 may include more nucleation inducing topography features 404f than the underlying at least one further semiconductor region 806, 808 (e.g., than the first further semiconductor region 806 and/or, if present, the second further semiconductor region 808). By way of example, the segregation suppression structure 404 may include more edges than the at least one further semiconductor region 806, 808. Alternatively or additionally, the segregation suppression structure 404 may include more recesses than the at least one further semiconductor region 806, 808. Alternatively or additionally, the segregation suppression structure 404 may include more protrusions than the at least one further semiconductor region 806, 808.

The electronic component 900c may be similar to the electronic components 800c, wherein a segregation suppression structure 404 may be formed over the at least one ohmic contact region 810. The segregation suppression structure 404 may include more nucleation inducing topography features 404f than the underlying at least one ohmic contact region 810. By way of example, the segregation suppression structure 404 may include more edges than the at least one ohmic contact region 810. Alternatively or additionally, the segregation suppression structure 404 may include more recesses than the at least one ohmic contact region 810. Alternatively or additionally, the segregation suppression structure 404 may include more protrusions than the at least one ohmic contact region 810.

Forming the segregation suppression structure 404 may include forming a segregation suppression layer (e.g., including a metallic material, e.g., a metal or a metal alloy including the metal). The segregation suppression layer may be provided by forming a liner (e.g., including or formed from a shottky metal).

The metal of the segregation suppression structure 404 may be different than a dopant of the underlying semiconductor region 802, 804, 806, 808. Alternatively or additionally, the metal of the segregation suppression structure 404 may be different than a metal of the underlying at least one ohmic contact region 810. By way of example, the metal layer may include or be formed from titanium.

Forming the segregation suppression structure 404 may further include structuring the segregation suppression layer. By structuring the segregation suppression layer the at least one nucleation inducing topography features 404f may be formed. By way of example, the segregation suppression layer may be structured using photolithography and etching (e.g., at least one of wet etching and dry etching). Alternatively or additionally, other structuring method may be used, e.g., a lift-off process, laser ablation, and the like. For example, dry etching may include or be formed from plasma etching.

For example, photolithography and the lift-off process may include forming a mask layer. In this case, structuring the segregation suppression layer may further include removing the mask layer. By way of example, in case of the lift-off process, the segregation suppression layer may be formed over the mask layer. In case of the photolithography, the mask layer may be formed over the segregation suppression layer. The mask layer may include or be formed from a polymer, e.g., a resist, e.g., a photosensitive resist. Alternatively or additionally, the mask layer may include or be formed from another polymer, e.g., an imide (e.g., a polyimide), a resin, an epoxy, a mold compound.

By way of example, the electronic component 900a, 900b, 900c may include or be formed from a shottky diode. In this case, the segregation suppression structure 404 may include or be formed from a shottky contact layer.

Figure 10A:
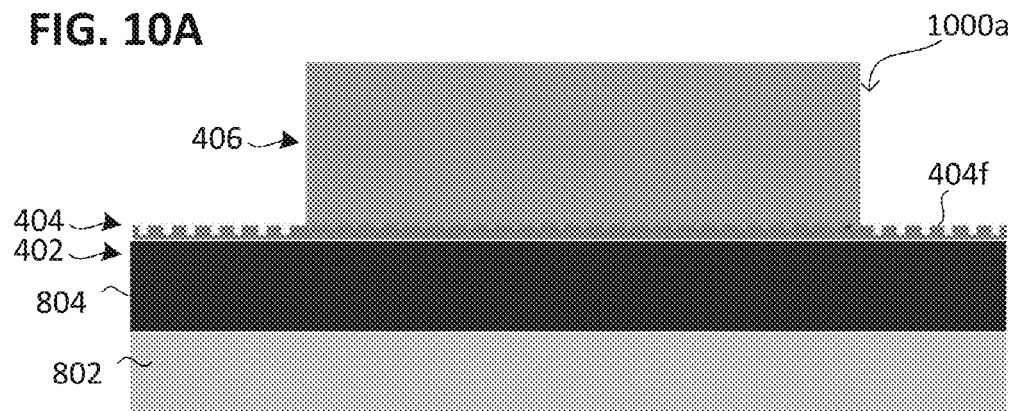
FIG. 10A to FIG. 10C respectively show an electronic component in a method according to various embodiments in a schematical cross sectional view or side view.
Figure 10B:
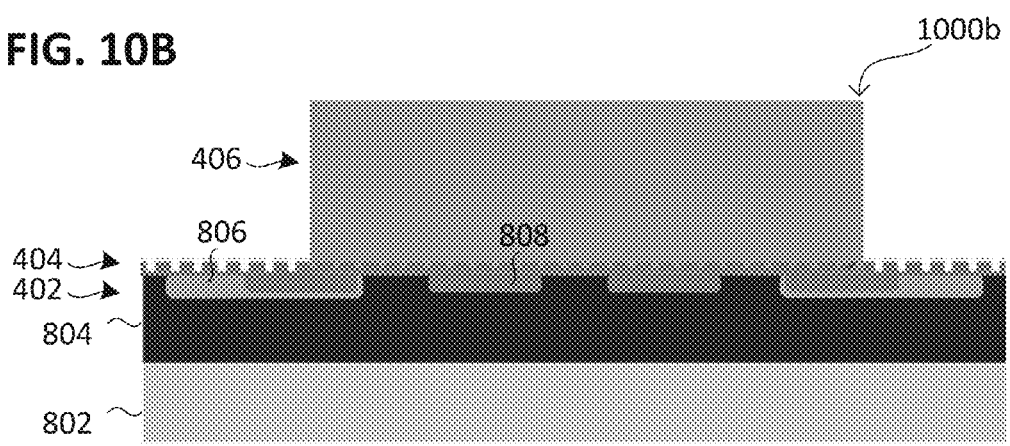
Figure 10C:
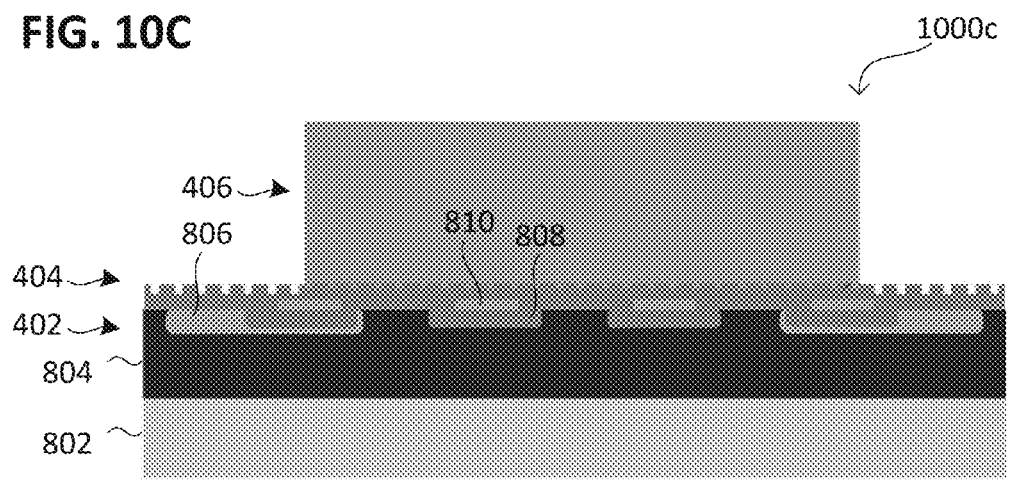

FIG. 10A to FIG. 10C respectively illustrate an electronic component in a method according to various embodiments in a schematical cross sectional view or side view (e.g., along a macroscopic surface normal 404n of the electrically conductive contact region 402). The electronic component 1000a may be similar to the electronic components 900a. The electronic component 1000b may be similar to the electronic components 900b. The electronic component 1000c may be similar to the electronic components 900c.

According to various embodiments, the metallization 406 may be formed over the segregation suppression structure 404 of the electronic component 1000a, 1000b, 1000c. The metallization 406 may optionally include or be formed from a contact pad. The metallization 406 may include or be formed from a metallic self-segregating composition, e.g., a metal alloy including at least one metal, e.g., at least two metals. The metal of the metallization 406 may be at least one of the second dopant and the metal of the at least one ohmic contact region 810. Alternatively or additionally, the metal of the metallization 406 may be at least one of the host material and the alloying element of the self-segregating composition. By way of example, the metal may be aluminium. Alternatively or additionally, the alloying element may be copper.

Forming the metallization 406 may include disposing the self-segregating composition (e.g., a layer therefrom) over the segregation suppression structure 404. Optionally, the forming the metallization 406 may include structuring the self-segregating composition (e.g., the layer therefrom), e.g., for forming at least one contact pad.

By way of example, the self-segregating composition (e.g., the layer therefrom) may be structured using photolithography and etching. Alternatively or additionally, other structuring method may be used, e.g., a lift-off process, laser ablation, and the like. For example, photolithography and the lift-off process may include forming a mask layer. In this case, structuring the self-segregating composition may further include removing the mask layer. By way of example, in case of the lift-off process, the self-segregating composition may be formed over the mask layer. In case of the photolithography, the mask layer may be formed over the self-segregating composition. The mask layer may include or be formed from a polymer, e.g., a resist, e.g., a photosensitive resist. Alternatively or additionally, the mask layer may include or be formed from another polymer, e.g., an imide (e.g., a polyimide), a resin, an epoxy, a mold compound.

Disposing the self-segregating composition (e.g., the layer therefrom) may include using a physical vapor deposition, e.g., sputtering. Alternatively or additionally, the self-segregating composition may be disposed using an electrochemical process, e.g., plating, or electroless plating.

The at least one electrically conductive contact region 404, e.g., at least one of the first semiconductor region 802 (or, if present, the second semiconductor region 804), the at least one further semiconductor region 806, 808 and the at least one ohmic contact region 810 may be electrically connected to the metallization 406 via the segregation suppression structure 404. By way of example, the electronic component 1000a, 1000b, 1000c may include or be formed from a shottky diode. In this case, the segregation suppression structure 404 may include or be formed from a front side metallization.

Figure 11A:
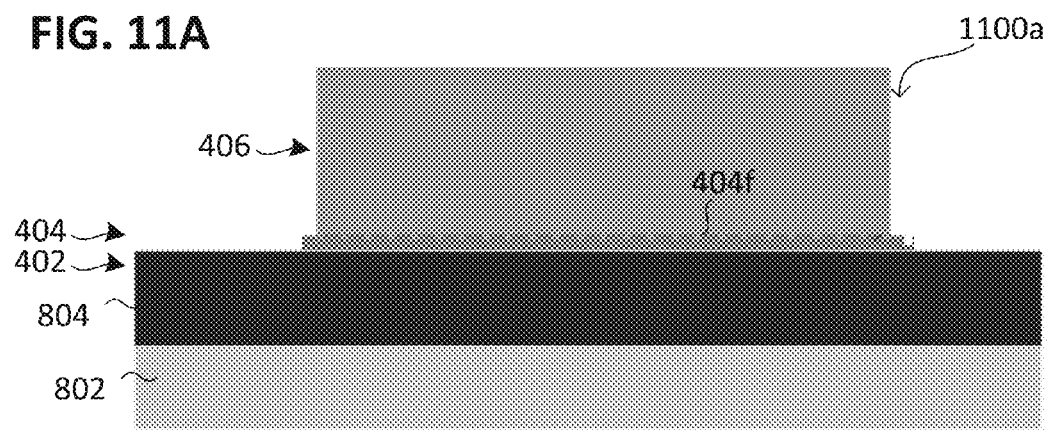
FIG. 11A to FIG. 11C respectively show an electronic component in a method according to various embodiments in a schematical cross sectional view or side view.
Figure 11B:
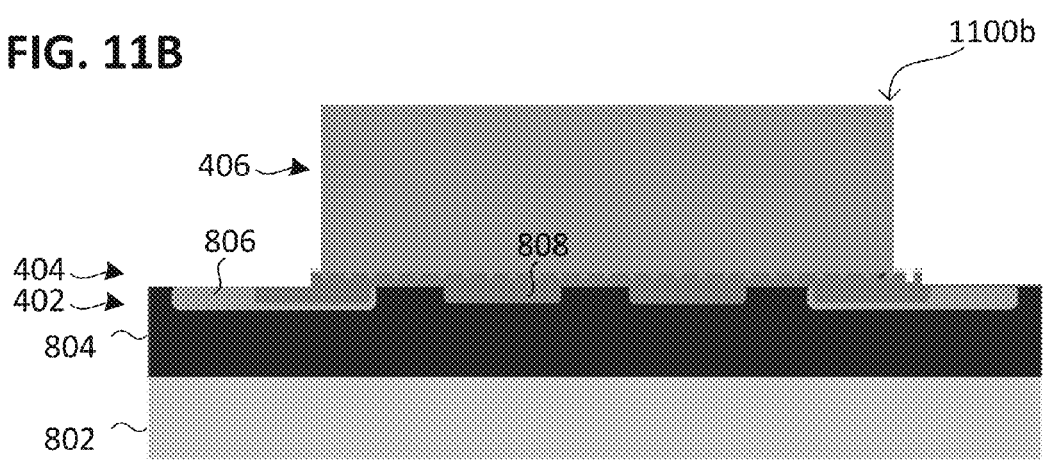
Figure 11C:
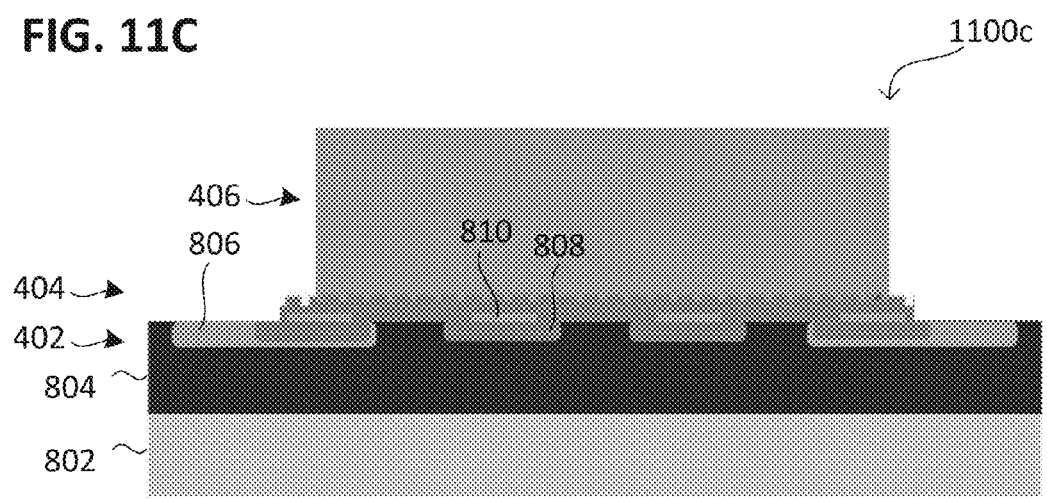

FIG. 11A to FIG. 11C respectively illustrate an electronic component in a method according to various embodiments in a schematical cross sectional view or side view (e.g., along a macroscopic surface normal 404n of the electrically conductive contact region 402).

The electronic component 1100a may be similar to the electronic components 1000a. According to various embodiments, the segregation suppression structure 404 may be partially removed, e.g., after forming the metallization 406. By partially removing the segregation suppression structure 404, the first semiconductor region 802 or, if present, the second semiconductor region 804 may be partially exposed.

The electronic component 1100b may be similar to the electronic components 1000b. According to various embodiments, the segregation suppression structure 404 may be partially removed, e.g., after forming the metallization 406. By partially removing the segregation suppression structure 404, the at least one further semiconductor region 806, 808 may be partially exposed.

The electronic component 1100c may be similar to the electronic components 1000c. According to various embodiments, the segregation suppression structure 404 may be partially removed, e.g., after forming the metallization 406. By removing the segregation suppression structure 404, the at least one further semiconductor region 806, 808 may be partially exposed. By way of example, the at least one ohmic contact region 810 may remain covered by the segregation suppression structure 404.

By way of example, the segregation suppression structure 404 may be partially removed using photolithography and etching. Alternatively or additionally, other removing methods may be used, e.g., a lift-off process, laser ablation, and the like. For example, photolithography and the lift-off process may include forming a mask layer. In this case, partially removing the segregation suppression structure 404 may further include removing the mask layer. By way of example, in case of the lift-off process, the segregation suppression structure 404 may be formed over the mask layer. In case of the photolithography, the mask layer may be formed over the segregation suppression structure 404. The mask layer may include or be formed from a polymer, e.g., a resist, e.g., a photosensitive resist. Alternatively or additionally, the mask layer may include or be formed from another polymer, e.g., an imide (e.g., a polyimide), a resin, an epoxy, a mold compound.

Figure 12A:
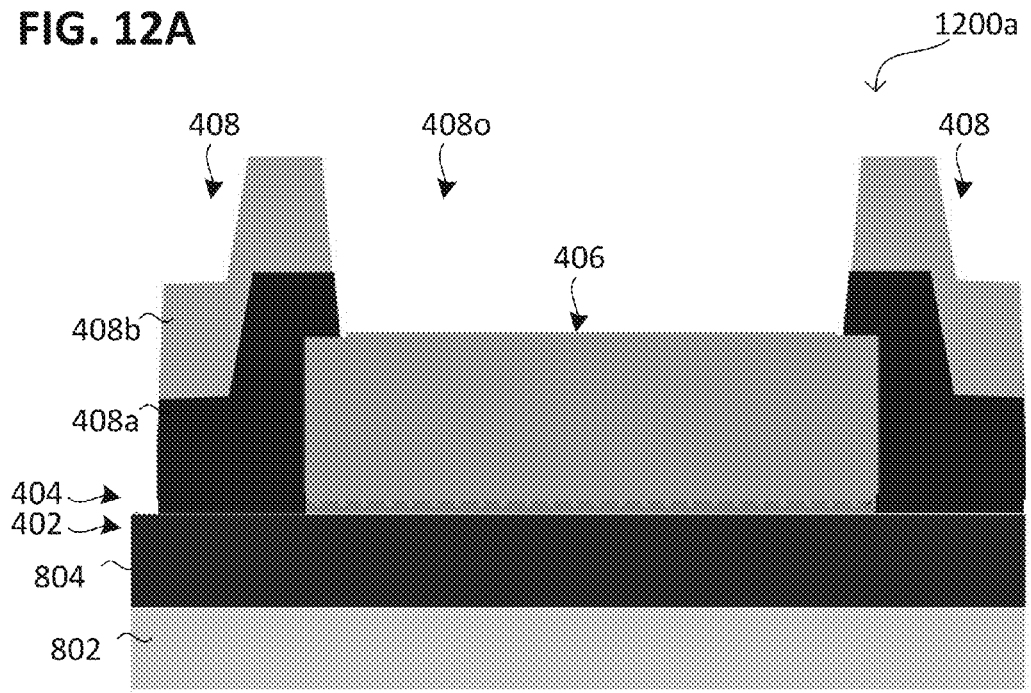
FIG. 12A to FIG. 13 respectively show an electronic component in a method according to various embodiments in a schematical cross sectional view or side view.
Figure 12B:
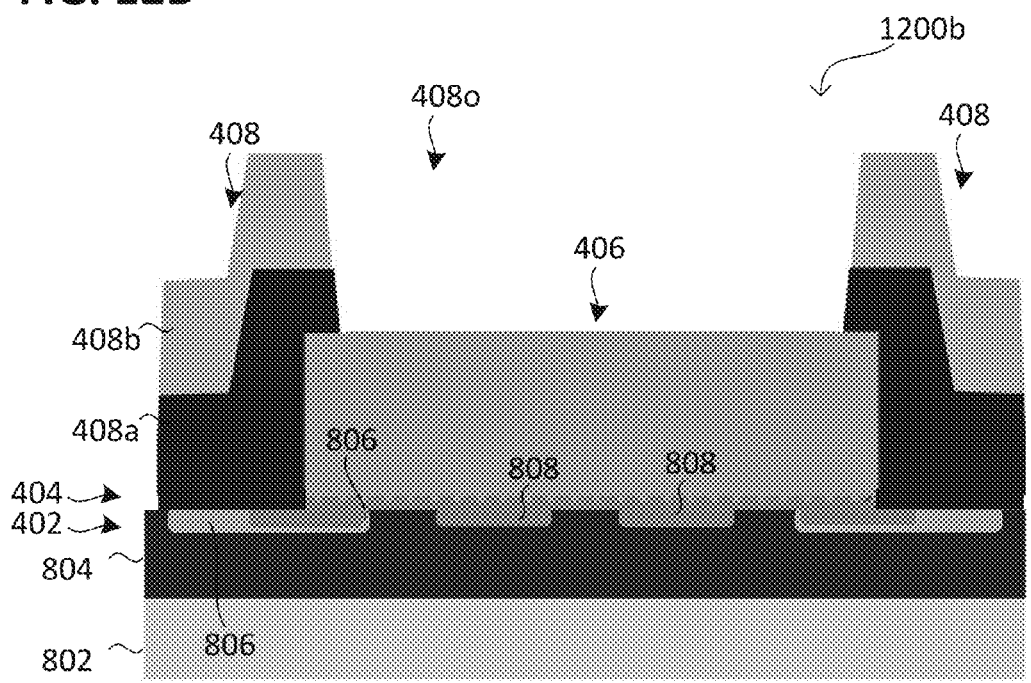
Figure 13:
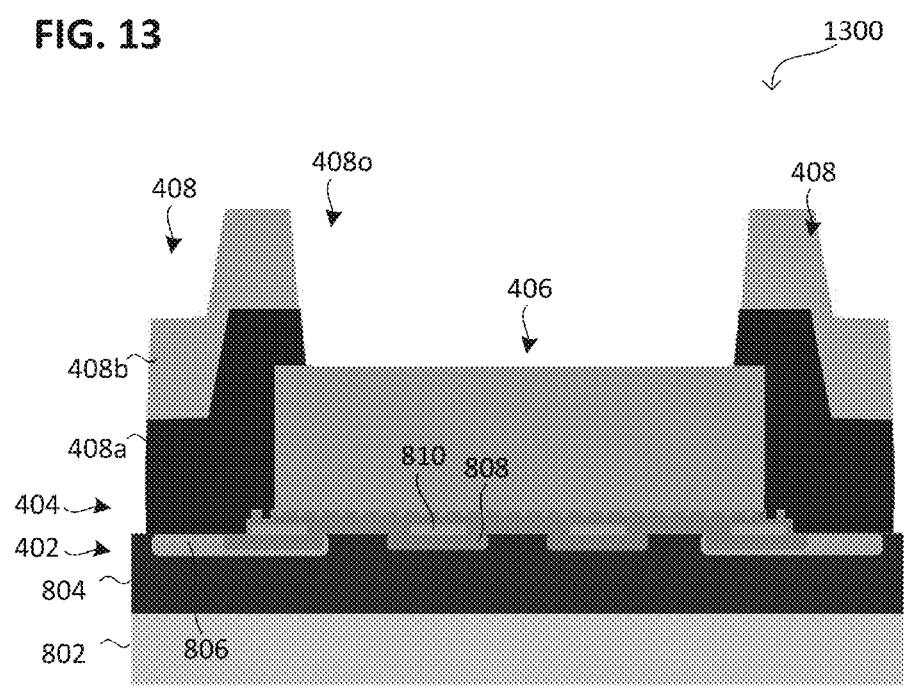

FIG. 12A, FIG. 12B and FIG. 13 respectively illustrate an electronic component in a method according to various embodiments in a schematical cross sectional view or side view (e.g., along a macroscopic surface normal 404n of the electrically conductive contact region 402).

The electronic component 1200a may be similar to the electronic components 1100a. According to various embodiments, at least one passivation layer 408 may be formed over the electronic component 1100a. The at least one passivation layer 408 may be formed over the first semiconductor region 802 or, if present, the second semiconductor region 804.

The electronic component 1200b may be similar to the electronic components 1100b. According to various embodiments, at least one passivation layer 408 may be formed over the electronic component 1100b. The at least one passivation layer 408 may be formed over the at least one further semiconductor region 806, 808.

The electronic component 1300 may be similar to the electronic components 1100c. According to various embodiments, at least one passivation layer 408 may be formed over the electronic component 1100c. The at least one passivation layer 408 may be formed over the at least one further semiconductor region 806, 808.

Further, the at least one passivation layer 408 may optionally be formed partially over the metallization 406. The at least one passivation layer 408 may include an opening 408o at least exposing the metallization 406. If the metallization 406 includes more than one contact pad, the at least one passivation layer 408 may include more than one opening, each partially exposing one contact pad of the metallization 406.

The at least one passivation layer 408 may include or be formed from an electrically insulating material. According to various embodiments, an electrically insulating material may include or be formed from a semiconductor oxide, a metal oxide, a ceramic, a semiconductor nitride, a semiconductor carbide, a glass, e.g., fluorosilicate glass (FSG), a polymer, e.g., a resin, an adhesive, a resist, benzocyclobutene (BCB) or polyimide (PI), a silicate, e.g., hafnium silicate or zirconium silicate, a transition metal oxide, e.g., hafnium dioxide or zirconium dioxide, an oxynitride, e.g., silicon oxynitride, or any other dielectric material types. Alternatively or additionally, the at least one passivation layer 408 may include or be formed from at least one of a hard-passivation layer 408a and a polymer layer 408b.

The hard-passivation layer 408a may include or be formed from at least one of a nitride, an oxide and a carbide. By way of example, the hard-passivation layer 408a may include or be formed from a semiconductor nitride, e.g., silicon nitride. Alternatively or additionally, the hard-passivation layer 408a may include or be formed from a semiconductor oxide, e.g., silicon oxide (also referred to as silicon glass). The semiconductor of the hard-passivation layer 408a may be undoped. The polymer layer 408b may include at least one of the following: an imide (e.g., a polyimide), a resin, an epoxy, a mold compound.

According to various embodiments, the at least one passivation layer 408 may be structured, e.g., to form the opening 408o. By way of example, the at least one passivation layer 408 may be structured using photolithography and etching (e.g., using a flour based etchant like sulfur hexafluoride or phosphor tetrafluoride). Alternatively or additionally, other structuring method may be used, e.g., a lift-off process, laser ablation, and the like. For example, photolithography and the lift-off process may include forming a mask layer. In this case, structuring the at least one passivation layer 408 may further include removing the mask layer. By way of example, in case of the lift-off process, the at least one passivation layer 408 may be formed over the mask layer. In case of the photolithography, the mask layer may be formed over the at least one passivation layer 408. The mask layer may include or be formed from a polymer, e.g., a resist, e.g., a photosensitive resist. Alternatively or additionally, the mask layer may include or be formed from another polymer, e.g., an imide (e.g., a polyimide), a resin, an epoxy, a mold compound.

Figure 14A:
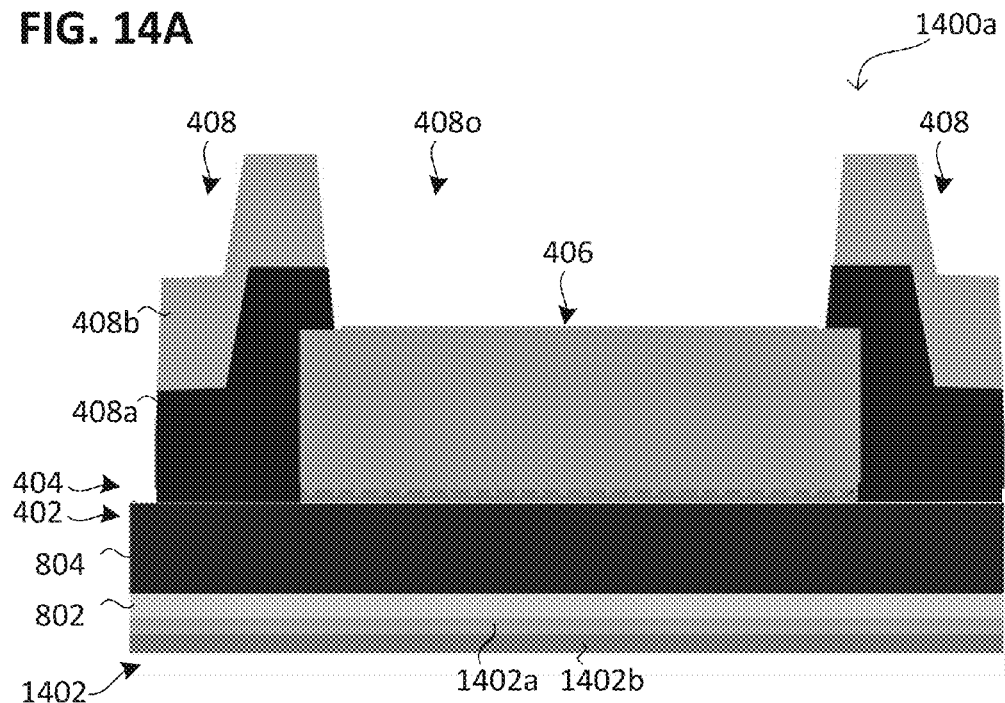
FIG. 14A to FIG. 15 respectively show an electronic component in a method according to various embodiments in a schematical cross sectional view or side view.
Figure 14B:
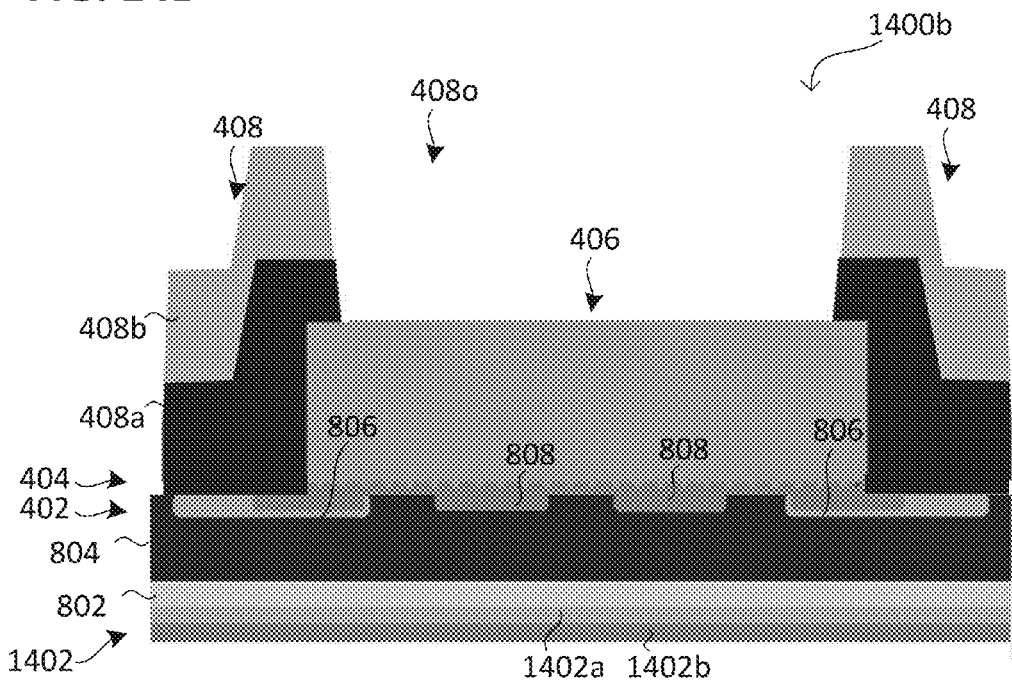
Figure 15:
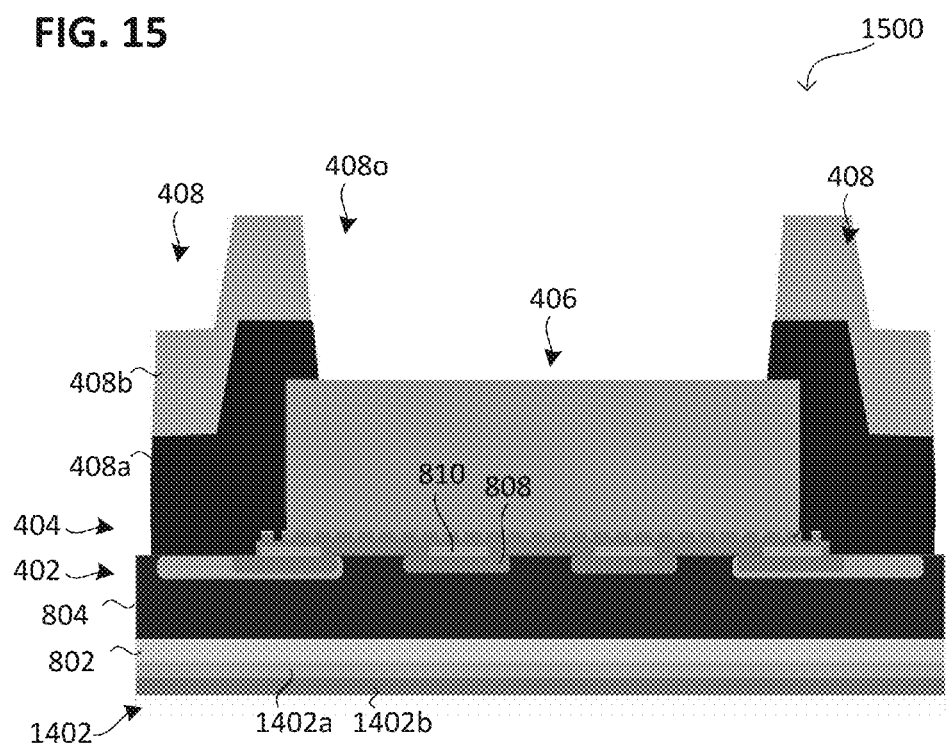

FIG. 14A, FIG. 14B and FIG. 15 respectively illustrate an electronic component in a method according to various embodiments in a schematical cross sectional view or side view (e.g., along a macroscopic surface normal 404n of the electrically conductive contact region 402).

The electronic component 1400a may be similar to the electronic components 1200a. The electronic component 1400b may be similar to the electronic components 1200b. The electronic component 1500 may be similar to the electronic components 1300.

According to various embodiments, the electronic component 1400a, 1400b, 1500 (e.g., its first semiconductor region 802) may be thinned, e.g., by subtractive manufacturing (e.g., including at least one of sanding, grinding, sawing, sandblasting, milling). Thinning electronic component 1400a, 1400b, 1500 may include removing material from a second side of the electronic component 1400a, 1400b, 1500 opposite the segregation suppression structure 404 by subtractive manufacturing. By thinning the electronic component 1400a, 1400b, 1500 (e.g., its first semiconductor region 802), a thickness of the electronic component 1400a, 1400b, 1500 may be reduced. For example, a thickness of the first semiconductor region 802 may be reduced to less than or equal to about 110 μm.

According to various embodiments, at least one electrically conductive layer 1402 may be formed. The at least one electrically conductive layer 1402 may include or be formed from at least one electrically conductive material. By way of example, the at least one electrically conductive layer 1402 may include or be formed from at least one of a compound layer 1402a and a further metallization 1402b.

By way of example, the compound layer 1402a may include or be formed from a compound including at least one of a semiconductor, e.g., silicon, and a metal. For example, the compound may be a binary compound, e.g., including the semiconductor and the metal, e.g., silicon and nickel. Alternatively or additionally, the further metallization 1402b may include a metallic material, e.g., a metal alloy. For example, the further metallization 1402b may include or be formed from at least one of: titanium, nickel, silver.

Figure 16A:
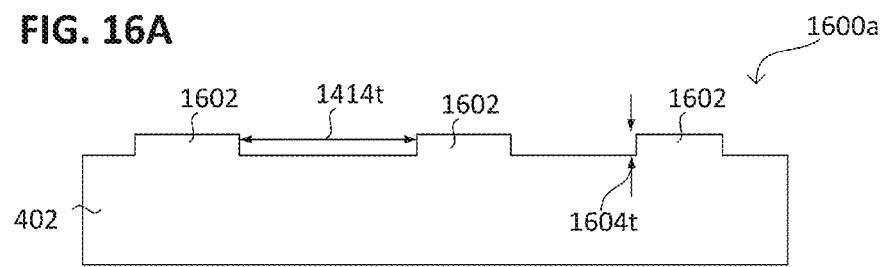
FIG. 16A and FIG. 16B respectively show an electronic component in a method according to various embodiments in a schematical cross sectional view or side view.
Figure 16B:
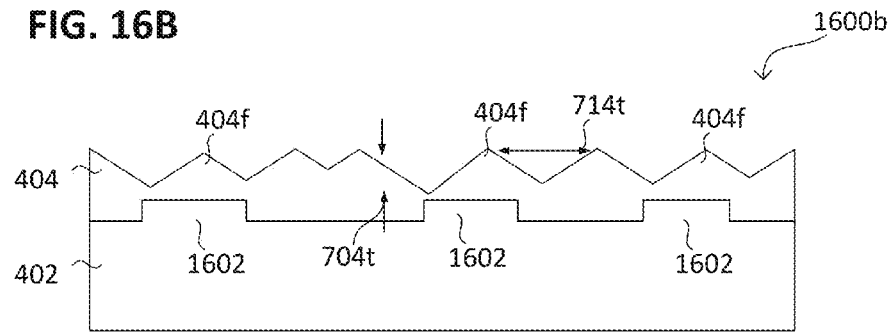

FIG. 16A and FIG. 16B respectively illustrate an electronic component in a method according to various embodiments in a schematical cross sectional view or side view (e.g., along a macroscopic surface normal 404n of the electrically conductive contact region 402).

In 1600a, the at least one electrically conductive contact region 402 (e.g., at least one of a semiconductor region and an ohmic contact region) may include a plurality of protrusions 1602. By way of example, each protrusion of the plurality of protrusions 1602 may include or be formed from first material protruding from a second material different than the first material. Alternatively or additionally, the first material and the second material are the same (illustratively, a monolithically formed at least one electrically conductive contact region 402). The plurality of protrusions 1602 may define a first roughness of the at least one electrically conductive contact region 402.

In 1600b, the segregation suppression structure 404 may be formed over the at least one electrically conductive contact region 402. The segregation suppression structure 404 may include or be formed from a plurality of topography features 404f. Each feature of the plurality of topography features 404f may include or be formed from a protrusion. The plurality of topography features 404f may define a second roughness of the segregation suppression structure 404.

The first roughness may be less than (e.g., about 75%, 50% or 25% of) the second roughness. For example, a spatially averaged height variation 1604t of the at least one electrically conductive contact region 402 may be less than (e.g., about 75%, 50% or 25% of) a spatially averaged height variation 704t of the segregation suppression structure 404. Alternatively or additionally, a number of protrusions 1602 of the at least one electrically conductive contact region 402 may be less than (e.g., about 75%, 50% or 25% of) a number of topography features 404f of the segregation suppression structure 404 (e.g., per area). Alternatively or additionally, a spatially averaged distance 714t of adjacent topography features 404f of the segregation suppression structure 404 may be less than (e.g., about 75%, 50% or 25% of) a spatially averaged distance 1414t of adjacent protrusions 1602 of the at least one electrically conductive contact region 402. For example, at least one topography feature of the segregation suppression structure 404 may be disposed over a region of the at least one electrically conductive contact region 402 between two adjacent protrusions 1602 of the at least one electrically conductive contact region 402.

For example, the spatially averaged height variation 1604t of the at least one electrically conductive contact region 402 may be less than about 200 nm, e.g., less than about 100 nm, e.g., less than about 50 nm. Alternatively or additionally, a spatially averaged height variation 704t of the segregation suppression structure 404 may be more than about 50 nm, e.g., more than about 100 nm, e.g., more than about 200 nm, e.g., more than about 300 nm, e.g., more than about 500 nm, e.g., more than about 600 nm.

According to various embodiments, the spatially averaged distance 1414t of adjacent protrusions 1602 of the segregation suppression structure 404 may be more than about 10 µm, e.g., more or equal to about 13 µm, e.g., e.g., more or equal to about 15 µm, e.g., more or equal to about 20 µm, e.g., more or equal to about 50 µm, e.g., more or equal to about 100 µm.

According to various embodiments, the averaged distance 714t of adjacent topography features 404f of the segregation suppression structure 404 may be less than or equal to about 20 µm, e.g., less than or equal to about 15 µm, e.g., less than or equal to about 10 µm, e.g., less than or equal to about 5 µm, e.g., less than or equal to about 2 µm, e.g., less than or equal to about 1 µm, e.g., less than or equal to about 0.5 µm, e.g., in the range from about 0.1 µm to about 20 µm, e.g., in the range from about 0.1 µm to about 10 µm or less than or less than or equal to about 0.1 µm.

According to various embodiments, the spatially averaged height variation 704t of the segregation suppression structure 404 may be more than about 1 nm, e.g., more or equal to about 10 nm, e.g., e.g., more or equal to about 25 nm, e.g., more or equal to about 50 nm, e.g., more or equal to about 75 nm, e.g., more or equal to about 100 nm.

Figure 17A:
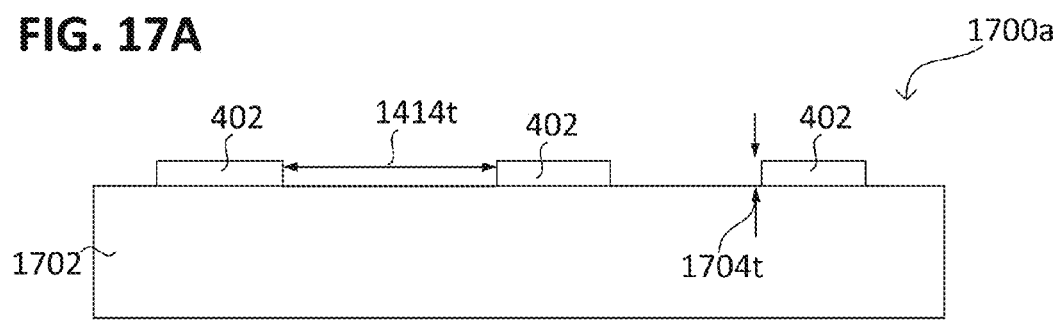
FIG. 17A and FIG. 17B respectively show an electronic component in a method according to various embodiments in a schematical cross sectional view or side view.
Figure 17B:
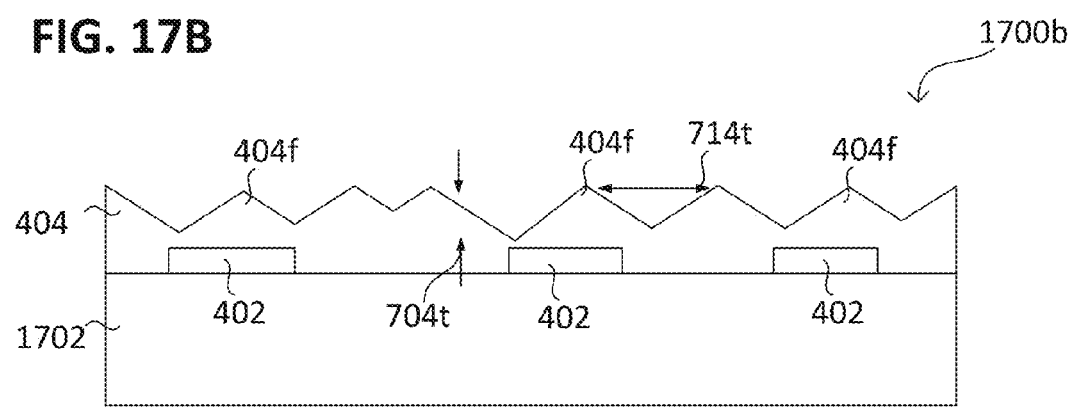

FIG. 17A and FIG. 17B respectively illustrate an electronic component in a method according to various embodiments in a schematical cross sectional view or side view (e.g., along a macroscopic surface normal 404n of the electrically conductive contact region 402).

In 1700a, the electronic component may include a plurality of electrically conductive contact regions 402. By way of example, each electrically conductive contact region of the plurality of electrically conductive contact regions 402 may include or be formed from an ohmic contact region. Alternatively or additionally, each electrically conductive contact region of the plurality of electrically conductive contact regions 402 may protrude from a semiconductor region 1702 of the electronic component (e.g., the at least one semiconductor region 802, 804 and/or the at least one further semiconductor region 806, 808). The plurality of electrically conductive contact regions 402 may define a first roughness of the electronic component.

In 1700b, the segregation suppression structure 404 may be formed over the plurality of electrically conductive contact regions 402. The segregation suppression structure 404 may be configured to as described before. The segregation suppression structure 404 may include or be formed from a plurality of topography features 404f. Each feature of the plurality of topography features 404f may include or be formed from a protrusion. The plurality of topography features 404f may define a second roughness of the segregation suppression structure 404.

The first roughness may be less than (e.g., about 75%, 50% or 25% of) the second roughness. For example, a spatially averaged protrusion 1704t of the plurality of electrically conductive contact regions 402 may be less than (e.g., about 75%, 50% or 25% of) a spatially averaged height variation 704t of the segregation suppression structure 404. Alternatively or additionally, a number of electrically conductive contact region 402 of the plurality of electrically conductive contact regions 402 may be less than (e.g., about 75%, 50% or 25% of) a number of topography features 404f of the segregation suppression structure 404 (e.g., per area). Alternatively or additionally, a spatially averaged distance 714t of adjacent topography features 404f of the segregation suppression structure 404 may be less than (e.g., about 75%, 50% or 25% of) a spatially averaged distance 1414t of adjacent electrically conductive contact regions 402 of the plurality of electrically conductive contact regions 402. For example, at least one topography feature of the segregation suppression structure 404 may be disposed over a region of the electronic component between two adjacent electrically conductive contact regions of the plurality of electrically conductive contact regions 402.

For example, the spatially averaged protrusion 1704t (or more generally, a respective height variation) of the plurality of electrically conductive contact regions 402 may be less than about 200 nm, e.g., less than about 100 nm, e.g., less than about 50 nm. Alternatively or additionally, a spatially averaged height variation 704t of the segregation suppression structure 404 may be more than about 50 nm, e.g., more than about 100 nm, e.g., more than about 200 nm, e.g., more than about 300 nm, e.g., more than about 500 nm, e.g., more than about 600 nm.

According to various embodiments, the spatially averaged distance 1414t of adjacent electrically conductive contact regions 402 may be more than about 10 µm, e.g., more or equal to about 13 µm, e.g., e.g., more or equal to about 15 µm, e.g., more or equal to about 20 µm, e.g., more or equal to about 50 µm, e.g., more or equal to about 100 µm.

Figure 18A:
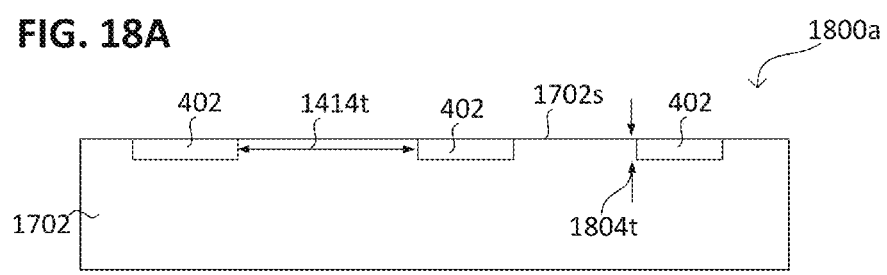
FIG. 18A and FIG. 18B respectively show an electronic component in a method according to various embodiments in a schematical cross sectional view or side view.
Figure 18B:
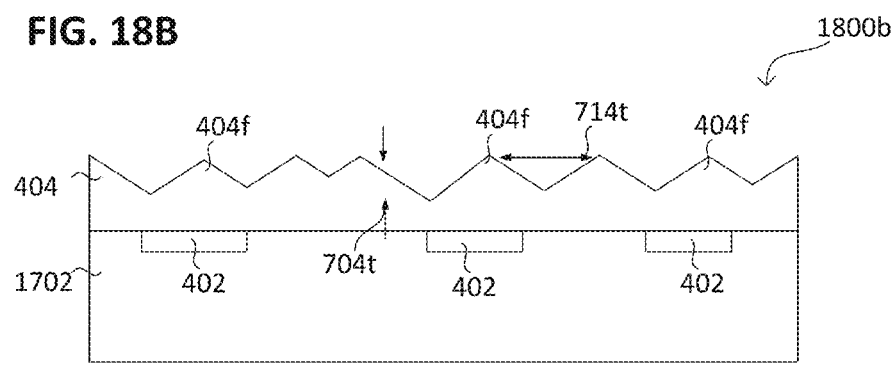

FIG. 18A and FIG. 18B respectively illustrate an electronic component in a method according to various embodiments in a schematical cross sectional view or side view (e.g., along a macroscopic surface normal 404n of the electrically conductive contact region 402).

In 1800a, the electronic component may include a plurality of electrically conductive contact regions 402. By way of example, each electrically conductive contact region of the plurality of electrically conductive contact regions 402 may include or be formed from an ohmic contact region. Alternatively or additionally, each electrically conductive contact region of the plurality of electrically conductive contact regions 402 may extend into the semiconductor region 1702 of the electronic component. A surface 1702s of the electronic component proximate the plurality of electrically conductive contact regions 402 may define a first roughness of the electronic component.

In 1800b, the segregation suppression structure 404 may be formed over the surface 1702s. The segregation suppression structure 404 may be configured to as described before. The segregation suppression structure 404 may include or be formed from a plurality of topography features 404f. Each feature of the plurality of topography features 404f may include or be formed from a protrusion. The plurality of topography features 404f may define a second roughness of the segregation suppression structure 404.

The first roughness may be less than (e.g., about 75%, 50% or 25% of) the second roughness. Alternatively or additionally, a spatially averaged extension 1804t of the plurality of electrically conductive contact regions 402 into the semiconductor region 1702 may be less than (e.g., about 75%, 50% or 25% of) a spatially averaged height variation 704t of the segregation suppression structure 404. Alternatively or additionally, a number of electrically conductive contact region 402 of the plurality of electrically conductive contact regions 402 may be less than (e.g., about 75%, 50% or 25% of) a number of topography features 404f of the segregation suppression structure 404 (e.g., per area). Alternatively or additionally, a spatially averaged distance 714t of adjacent topography features 404f of the segregation suppression structure 404 may be less than (e.g., about 75%, 50% or 25% of) a spatially averaged distance 1414t of adjacent electrically conductive contact regions 402 of the plurality of electrically conductive contact regions 402. For example, at least one topography feature of the segregation suppression structure 404 may be disposed over a region of the electronic component between two adjacent electrically conductive contact regions of the plurality of electrically conductive contact regions 402.

For example, the spatially averaged extension 1804t (or more generally, a respective height variation) of the plurality of electrically conductive contact regions 402 may be less than about 200 nm, e.g., less than about 100 nm, e.g., less than about 50 nm. Alternatively or additionally, a spatially averaged height variation 704t of the segregation suppression structure 404 may be more than about 50 nm, e.g., more than about 100 nm, e.g., more than about 200 nm, e.g., more than about 300 nm, e.g., more than about 500 nm, e.g., more than about 600 nm.

According to various embodiments, the spatially averaged distance 1414t of adjacent electrically conductive contact regions 402 may be more than about 10 μm, e.g., more or equal to about 13 μm, e.g., e.g., more or equal to about 15 μm, e.g., more or equal to about 20 μm, e.g., more or equal to about 50 μm, e.g., more or equal to about 100 μm.

Figure 19A:
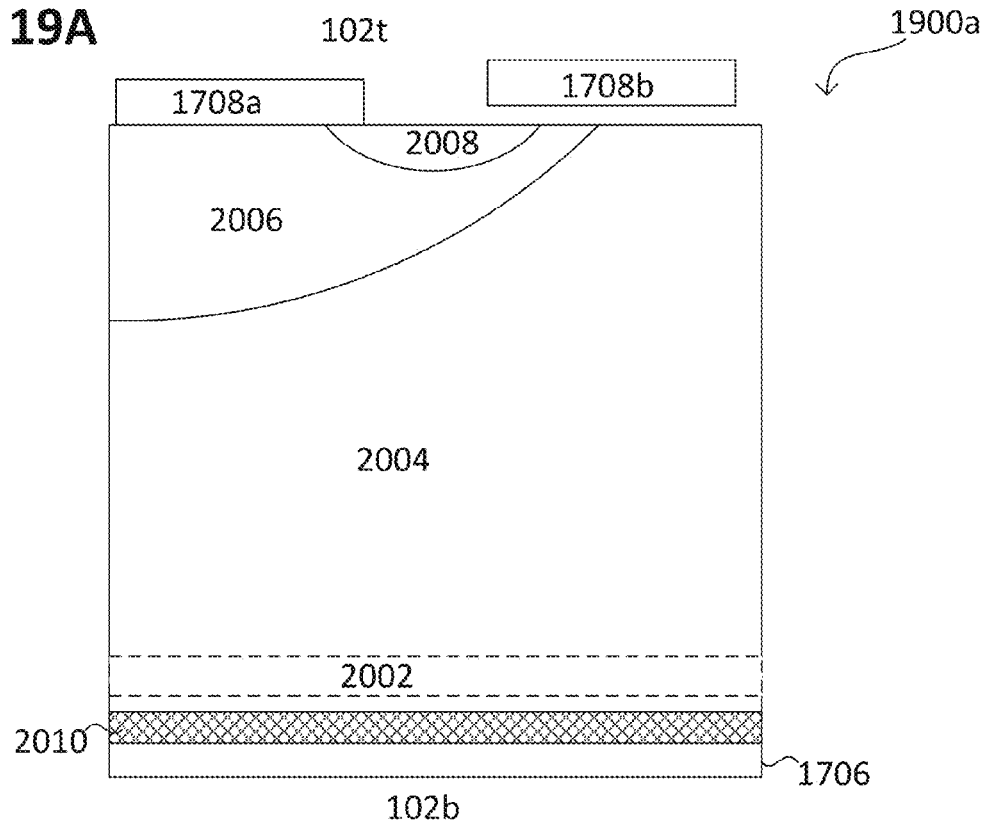
FIG. 19A and FIG. 19B respectively show an electronic component in a method according to various embodiments in a schematical cross sectional view or side view.

FIG. 19A illustrates an electronic component 1900a (e.g., a semiconductor device 1900a) according to various embodiments in a method according to various embodiments in a schematic cross sectional view or side view (e.g., along a macroscopic surface normal 404n of the electrically conductive contact region 402), e.g., a semiconductor circuit element, e.g., a power semiconductor circuit element.

The electronic component 1900a may include a doped semiconductor layer 2010 formed on the second side 102b. The doped semiconductor layer 2010 may include or be formed from a first doping type. The doped semiconductor layer 2010 may include or be formed from an electrically conductive contact region 402, e.g., a collector region (an electrically conductive doped semiconductor region in form of a collector region).

The electronic component 1900a may further include a first contact pad 1706 in form of a collector contact pad 1706 (e.g., a drain contact pad). The first contact pad 1706 may electrical contact the doped semiconductor layer 2010, optionally via a segregation suppression structure 404 disposed therebetween.

Further, the electronic component 1900a may include a first doped region 2006. The first doped region 2006 may include or be formed from an electrically conductive contact region 402, e.g., a base region. The first doped region 2006 may include (e.g., a dopant having) a doping type equal to the doped semiconductor layer 2010 (in other words, the dopant of the doped semiconductor layer 2010), e.g., the first doping type. The electronic component 1900a may further include a second contact pad 1708a electrical contacting the first doped region 2006, optionally via the segregation suppression structure 404 disposed therebetween. The second contact pad 1708a may include or be formed from an emitter contact pad 1708a (e.g., a source contact pad 1708a).

Further, the electronic component 1900a may include a second doped region 2004 formed between the first doped region 2006 and the doped semiconductor layer 2010. The second doped region 2004 may include or be formed from a drift region. The second doped region 2004 may include a doping type (second doping type) different than the doped semiconductor layer 2010, e.g., a dopant having the second doping type. The second doped region 2004 may include an epitaxial formed layer (e.g., the second semiconductor region 804).

The electronic component 1900a may further include a further second contact pad 1708b. The further second contact pad 1708b may include or be formed from a gate contact pad 1708b. The further second contact pad 1708b may be formed electrical insulated from the second doped region 2004, e.g., by an electrically insulating material formed therebetween (between the further second contact pad 1708b and the second doped region 2004).

Further, the electronic component 1900a may include a third doped region 2008. The third doped region 2008 may include or be formed from an emitter region. The third doped region 2008 may include (e.g., a dopant having) a doping type different than the doped semiconductor layer 2010, e.g., the second doping type. A dopant concentration of the third doped region 2008 may be greater than of the second doped region 2004.

Optionally, the electronic component 1900a may include a fourth doped region 2002 between the second doped region 2004 and the doped semiconductor layer 2010. The fourth doped region 2002 may include or be formed from a field stop region. The fourth doped region 2002 may include a dopant having a doping type different than the doped semiconductor layer 2010. The fourth doped region 2002 may include a dopant concentration higher than the second doped region 2004.

According to various embodiments, the first doping type may be an n-doping type and the second doping type may be a p-doping type. Alternatively, the first doping type may be the p-doping type and the second doping type may be the n-doping type.

The electronic component 1900a, e.g., a semiconductor circuit element 1702, may include or be formed from a transistor structure (e.g., in an IGBT), e.g., a planar transistor structure (providing a vertical current flow). A transistor structure may include or be formed from a plurality of unipolar junctions (e.g., p-n junctions), e.g., forming a bipolar junction. A unipolar junction may be formed by an interface of two doped regions having different doping types, e.g., an interface between at least one the following: the first doped region 2006 and the second doped region 2004; the first doped region 2006 and the third doped region 2008; the second doped region 2004 and the doped semiconductor layer 2010; the doped semiconductor layer 2010 and the fourth doped region 2002.

According to various embodiments, the second doped region 2004 and the fourth doped region 2002 may include the same doping type. As described above, the doped semiconductor layer 2010 may differ from the second doped region 2004 and the fourth doped region 2002 in the doping type. In this case, the doped semiconductor layer 2010 may provide a backside emitter region (e.g., for an IGBT). Alternatively, the doped semiconductor layer 2010 may have the same doping type as the second doped region 2004 and the fourth doped region 2002. In this case, the doped semiconductor layer 2010 may provide a contact enhancement region (e.g., for a vertical metal-oxide-semiconductor field-effect transistor).

According to various embodiments, the electronic component 1900a, e.g., the semiconductor circuit element 1702, may include or be formed from insulated-gate bipolar transistor.

Figure 19B:
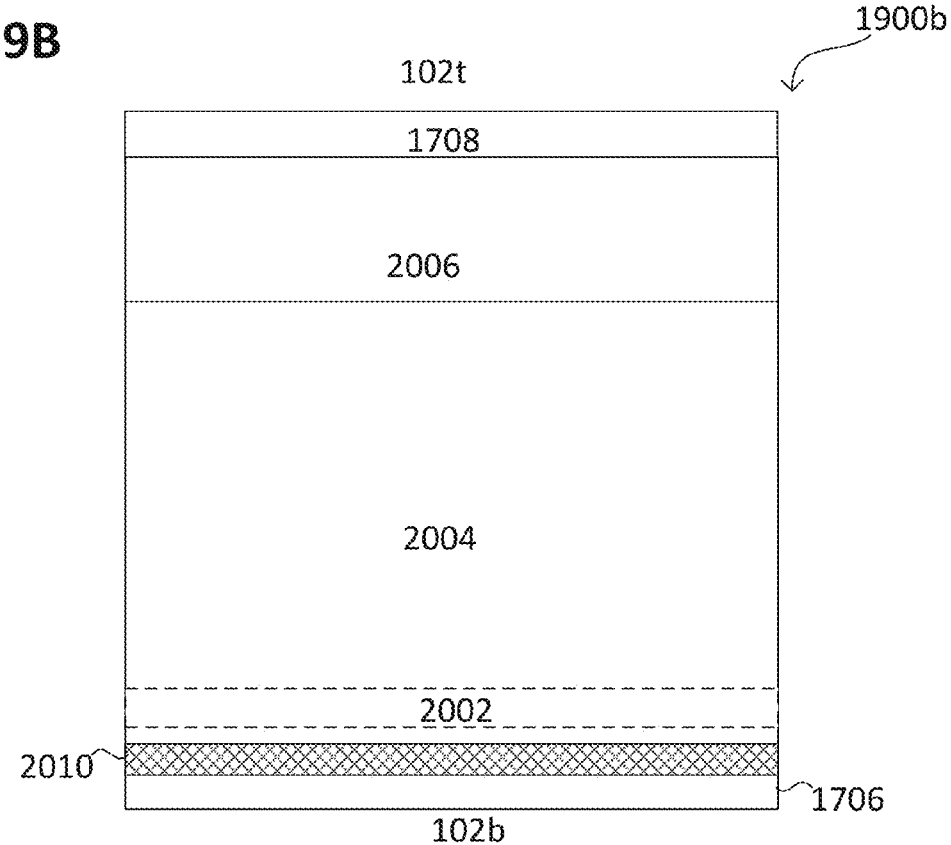

FIG. 19B illustrates an electronic component 1900b, e.g., a semiconductor device 1900b, according to various embodiments in a method according to various embodiments in a schematic cross sectional view or side view (e.g., along a macroscopic surface normal 404n of the electrically conductive contact region 402), e.g., a semiconductor circuit element, e.g., a power semiconductor circuit element.

The electronic component 1900b may include the doped semiconductor layer 2010 formed on the second side 102b. The doped semiconductor layer 2010 (in other words, the activated dopant) may include or be formed from a first doping type.

The electronic component 1900b may further include a first contact pad 1706 electrically contacting the doped semiconductor layer 2010, optionally via the segregation suppression structure 404 disposed therebetween. The first contact pad 1706 may include or be formed from an electrode contact pad. Illustratively, the first doped region 2006 may provide a thin doped region and/or the second doped region 2004 may provide a thick drift zone. The first doped region 2006 may be electrically and/or physically connected with a second contact pad 1708, optionally via the segregation suppression structure 404 disposed therebetween.

Further, the electronic component 1900b may include a first doped region 2006. The first doped region 2006 may include or be formed from a first junction region. The first doped region 2006 may include a dopant having a doping type different from the doped semiconductor layer 2010 (in other words, the dopant of the doped semiconductor layer 2010), e.g., the second doping type. The electronic component 1900b may further include the second contact pad 1708 electrical contacting the first doped region 2006, optionally via the segregation suppression structure 404 disposed therebetween. The second contact pad 1708 may include or be formed from an electrode contact pad. Further, the electronic component 1900b may include a second doped region 2004 formed between the first doped region 2006 and the doped semiconductor layer 2010. The second doped region 2004 may include or be formed from a second junction region. The second doped region 2004 may include a doping type equal to a doping type of the doped semiconductor layer 2010, e.g., a dopant having the first doping type.

Optionally, the electronic component 1900b may include a third doped region 2002 between the second doped region 2004 and the doped semiconductor layer 2010. The third doped region 2002 may include or be formed from a field stop region. The third doped region 2002 may include (e.g., a dopant having) a doping type equal to a doping type of the doped semiconductor layer 2010. The third doped region 2002 may include a dopant concentration higher than the second doped region 2004.

The electronic component 1900b may include or be formed from a diode structure, e.g., a planar diode structure (providing a vertical current flow). A diode structure may include or be formed from a p-n junction, e.g., formed by an interface of two doped regions having different doping types, e.g., an interface between the first doped region 2006 and the second doped region 2004.

Optionally, the doped semiconductor layer 2010 may include or be formed from a plurality of first segments including the first doping type and a plurality of second segments including the second doping type. The segments of the plurality of first segments and the segments of the plurality of second segments may be disposed in an alternating order. In this case, the doped semiconductor layer 2010 may be part of backward-diode structure.

Figure 20A:
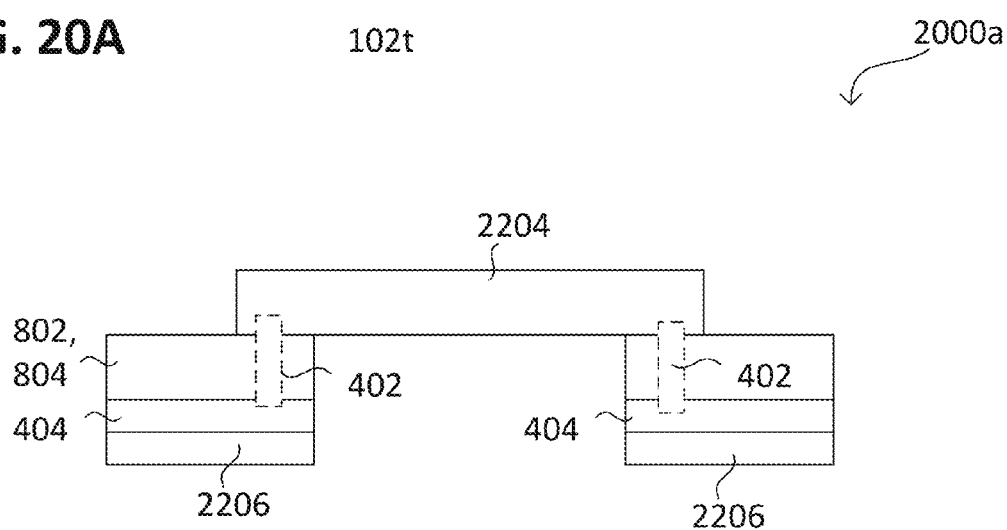
FIG. 20A and FIG. 20B respectively show an electronic component in a method according to various embodiments in a schematical cross sectional view or side view.
Figure 20B:
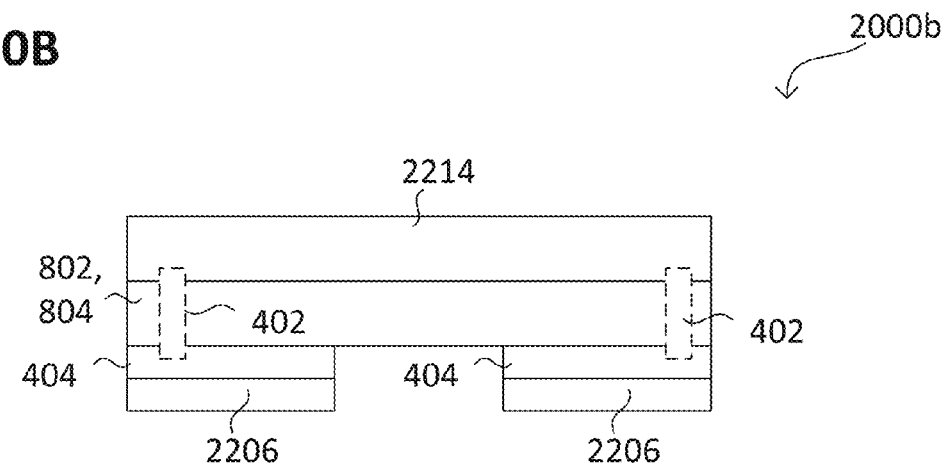

FIG. 20A and FIG. 20B respectively illustrate an electronic component in a method according to various embodiments in a schematical cross sectional view or side view (e.g., along a macroscopic surface normal 404n of the electrically conductive contact region 402).

According to various embodiments, the electronic component may include or be formed from at least one of an electromechanical component, an optoelectrical component and/or an optoelectromechanical component. In general, the electronic component may be configured to transform between electrical energy and at least one of electrical energy (e.g., in case of the electronic component), mechanical energy (e.g., in case of the electromechanical component), and optical energy (e.g., in case of the optoelectrical component), e.g., both optical and mechanical energy (e.g., in case of the optoelectromechanical component). Optical energy may include or be formed from radiation energy.

According to various embodiments, an electronic component 2000a (e.g., a microelectromechanical device, also referred to as microelectromechanical component) may include the at least one semiconductor region 802, 804 and a microelectromechanical element 2204 disposed over the at least one semiconductor region 802, 804. The microelectromechanical element 2204 may be configured to generate or modify an electrical signal in response to a mechanical signal and/or may be configured to generate or modify a mechanical signal in response to an electrical signal. Further, the electronic component 2000a may include at least one contact pad 2206 (e.g., two or more contact pads 2206). The at least one contact pad 2206 may be electrically connected to the microelectromechanical element 2204 via an at least one electrically conductive contact region 402 for transferring the electrical signal between the at least one contact pad 2206 and the microelectromechanical element 2204.

According to various embodiments, the segregation suppression structure 404 may be disposed between the at least one electrically conductive contact region 402 and the at least one contact pad 2206. The at least one electrically conductive contact region 402 may include or be formed from at least one of a through contact, a redistribution layer and an electrical interconnection. For example, the microelectromechanical element 2204 may include or be formed from a diaphragm, e.g., a microphone.

According to various embodiments, an electronic component 2000b (e.g., an optoelectrical device, also referred to as optoelectrical component) may include the at least one semiconductor region 802, 804 and an optoelectrical element 2214 disposed over the at least one semiconductor region 802, 804. The optoelectrical element 2214 may be configured to generate or modify an electrical signal in response to an optical signal and/or may be configured to generate or modify an optical signal in response to an electrical signal. Further, the electronic component 2000b may include at least one contact pad 2206. The at least one contact pad 2206 may be electrically connected to the optoelectrical element 2204 via an at least one electrically conductive contact region 402 for transferring the electrical signal between the at least one contact pad 2206 and the optoelectrical element 2214. The segregation suppression structure 404 may be disposed between the at least one electrically conductive contact region 402 and the at least one contact pad 2206. The at least one electrically conductive contact region 402 may include or be formed from at least one of a through contact, a redistribution layer and an electrical interconnection. For example, the optoelectrical element 2214 may include or be formed from a solid state light source (SSL), e.g., a semiconductor light-emitting diode (LED), an organic light-emitting diode (OLED), or a polymer light-emitting diodes (PLED).

Further, various embodiments will be described in the following.

According to various embodiments, a method for processing an electronic component including at least one electrically conductive contact region may include: forming a contact pad including a self-segregating composition over the at least one electrically conductive contact region to electrically contact the electronic component; forming a segregation suppression structure between the contact pad and the electronic component, wherein the segregation suppression structure may include more nucleation inducing topography features than the at least one electrically conductive contact region for perturbing a chemical segregation of the self-segregating composition by crystallographic interfaces of the contact pad defined by the nucleation inducing topography features. Alternatively or additionally (to more nucleation inducing topography features), the segregation suppression structure may include a greater area density of nucleation inducing topography features than the at least one electrically conductive surface for spatially limiting a chemical segregation of the self-segregating composition to a crystallite size of the contact pad defined by the area density of the nucleation inducing topography features.

According to various embodiments, a method for processing an electronic component including at least one electrically conductive surface may include: forming a metallization including a self-segregating composition over the at least one electrically conductive surface to electrically contact the electronic component; forming a segregation suppression structure between the metallization and the electronic component, wherein the segregation suppression structure may include more nucleation inducing topography features than the at least one electrically conductive contact region for perturbing a chemical segregation of the self-segregating composition by crystallographic interfaces of the metallization defined by the nucleation inducing topography features. Alternatively or additionally (to more nucleation inducing topography features), the segregation suppression structure may include a greater area density of nucleation inducing topography features than the at least one electrically conductive surface for spatially limiting a chemical segregation of the self-segregating composition to a crystallite size of the metallization defined by the area density of the nucleation inducing topography features.

According to various embodiments, a method for processing an electronic component including at least one electrically conductive surface may include: forming a metallization including an aluminum bronze over the at least one electrically conductive surface to electrically contact the electronic component; forming a segregation suppression structure between the metallization and the electronic component, wherein the segregation suppression structure may include more protrusions than the at least one electrically conductive contact region for perturbing a chemical segregation of the self-segregating composition by crystallographic interfaces of the metallization induced by the protrusions. Alternatively or additionally (to more protrusions), the segregation suppression structure may include a greater area density of protrusions than the at least one electrically conductive surface for spatially limiting a chemical segregation of the self-segregating composition to a crystallite size of the metallization defined by the area density of the protrusions.

According to various embodiments, the method may further include structuring the metallization to form at least one contact pad. For example, the method may further include forming at least one contact pad from the metallization.

According to various embodiments, each nucleation inducing topography feature of the segregation suppression structure may be configured to induce crystallite nucleation thereon such that a crystallographic interface is formed between adjacent nucleation inducing topography features of the segregation suppression structure.

According to various embodiments, at least one nucleation inducing topography feature of the segregation suppression structure may be disposed between two electrically conductive contact regions of the at least one electrically conductive contact region.

According to various embodiments, at least one nucleation inducing topography feature of the segregation suppression structure may be disposed between the at least one electrically conductive contact region and the contact pad.

According to various embodiments, the at least one electrically conductive contact region may include an ohmic characteristic.

According to various embodiments, the method may further include forming a passivation layer over the electronic component having at least one opening exposing the contact pad.

According to various embodiments, the method may further include forming a metallization on a side of the electronic component opposite the contact pad for electrically contacting the electronic component.

According to various embodiments, forming the contact pad may include forming a metallization and structuring the metallization.

According to various embodiments, structuring the metallization may include exposing the segregation suppression structure at least partially.

According to various embodiments, the electronic component may include a semiconductor region (e.g., electrically semiconducting); and the at least one electrically conductive contact region may protrude from the semiconductor region.

According to various embodiments, forming the segregation suppression structure may include forming a metallization over the at least one electrically conductive contact region and structuring the metallization to form the nucleation inducing topography features of the segregation suppression structure.

According to various embodiments, forming the segregation suppression structure may include forming a liner over the at least one electrically conductive contact region and structuring the liner to form the nucleation inducing topography features of the segregation suppression structure.

According to various embodiments, the segregation suppression structure may include or be formed from titanium.

According to various embodiments, the segregation suppression structure may include a greater roughness than the at least one electrically conductive contact region.

According to various embodiments, a roughness of the segregation suppression structure may be greater than a roughness of a surface of the electronic component between two electrically conductive contact regions of the at least one electrically conductive contact region.

According to various embodiments, an area density of crystallographic interfaces (of the metallization or the respective contact pad) induced by the at least one electrically conductive contact region may be less than an area density of crystallographic interfaces induced by the segregation suppression structure.

According to various embodiments, an area density of crystallites (of the metallization or the respective contact pad) may be greater than an area density of nucleation inducing topography features of the at least one electrically conductive contact region.

According to various embodiments, forming the contact pad may include forming more crystallites than the at least one electrically conductive contact region has nucleation inducing topography features.

According to various embodiments, forming the contact pad may include forming a greater area density of crystallites than an area density of the nucleation inducing topography features of the at least one electrically conductive contact region.

According to various embodiments, an averaged crystallite size (of the metallization or the respective contact pad) induced by the at least one electrically conductive contact region may be less than an averaged crystallite size induced by the segregation suppression structure.

According to various embodiments, each nucleation inducing topography feature of the segregation suppression structure may include or be formed from at least one of a protrusion and a recess.

According to various embodiments, each nucleation inducing topography feature of the segregation suppression structure may include or be formed from at least one edge.

According to various embodiments, the segregation suppression structure may include or be formed from a plurality of nucleation inducing topography features disposed between the at least one electrically conductive contact region and the metallization or the respective at least one contact pad.

According to various embodiments, a distance of two topography features of the segregation suppression structure may be less than a distance of two electrically conductive contact regions of the at least one electrically conductive contact region.

According to various embodiments, a distance of two topography features of the segregation suppression structure may be less than a distance of two topography features of the at least one electrically conductive contact region.

According to various embodiments, a distance of two topography features of the segregation suppression structure may be less than a distance of two protrusions of the at least one electrically conductive contact region.

According to various embodiments, the self-segregating composition may include or be formed from at least two different metals, e.g., a metal alloy including the at least two different metals.

According to various embodiments, the self-segregating composition may include or be formed from two metals differing from each other in the sign of their standard electrode potential.

According to various embodiments, the self-segregating composition may include or be formed from a noble metal and a base metal.

According to various embodiments, the self-segregating composition may include or be formed from at least two metals differing in their electronegativity by more than or equal to about 0.3.

According to various embodiments, the self-segregating composition may include or be formed from at least one of copper and aluminum.

According to various embodiments, the at least one electrically conductive contact region may include or be formed from at least one of nickel and aluminum.

According to various embodiments, the at least one electrically conductive contact region may be in physical contact with a doped region of the electronic component.

According to various embodiments, the at least one electrically conductive contact region may be in physical contact with a region of the electronic component doped with a metal of the at least one electrically conductive contact region.

According to various embodiments, the segregation suppression structure may be in physical contact with the metallization or the respective at least one contact pad.

According to various embodiments, the chemical segregation of the self-segregating composition may be at least partially induced by heating the metallization or the respective at least one contact pad (e.g., above a segregation temperature).

According to various embodiments, the method may further include heating the metallization or the respective at least one contact pad, e.g., to above a segregation temperature.

According to various embodiments, the electronic component may include or be formed from at least one power electronic component.

According to various embodiments, the electronic component may include or be formed from at least one of a diode and a transistor.

According to various embodiments, the electronic component may include or be formed from a microelectromechanical system.

According to various embodiments, an electronic component may include or be formed from: at least one electrically conductive contact region; a contact pad including a self-segregating composition disposed over the at least one electrically conductive contact region; a segregation suppression structure disposed between the contact pad and the electronic component, wherein the segregation suppression structure may include more nucleation inducing topography features than the at least one electrically conductive contact region for perturbing a chemical segregation of the self-segregating composition by crystallographic interfaces of the contact pad defined by the nucleation inducing topography features. Alternatively or additionally (to more nucleation inducing topography features), the segregation suppression structure may include a greater area density of nucleation inducing topography features than the at least one electrically conductive surface for spatially limiting a chemical segregation of the self-segregating composition to a crystallite size of the contact pad defined by the area density of the nucleation inducing topography features.

According to various embodiments, an electronic component may include or be formed from: at least one electrically conductive surface; a metallization including a self-segregating composition disposed over the at least one electrically conductive surface; a segregation suppression structure disposed between the metallization and the electronic component, wherein the segregation suppression structure may include more nucleation inducing topography features than the at least one electrically conductive contact region for perturbing a chemical segregation of the self-segregating composition by crystallographic interfaces of the metallization defined by the nucleation inducing topography features. Alternatively or additionally (to more nucleation inducing topography features), the segregation suppression structure may include a greater area density of nucleation inducing topography features than the at least one electrically conductive surface for spatially limiting a chemical segregation of the self-segregating composition to a crystallite size of the metallization defined by the area density of the nucleation inducing topography features.

According to various embodiments, an electronic component may include or be formed from: at least one electrically conductive surface; a metallization including an aluminum bronze disposed over the at least one electrically conductive surface; a segregation suppression structure disposed between the metallization and the electronic component, wherein the segregation suppression structure may include more protrusions than the at least one electrically conductive contact region for perturbing a chemical segregation of the self-segregating composition by crystallographic interfaces of the metallization induced by the protrusions. Alternatively or additionally (e.g., to more protrusions), the segregation suppression structure may include a greater area density of protrusions than the at least one electrically conductive surface for spatially limiting a chemical segregation of the self-segregating composition to a crystallite size of the metallization defined by the area density of the protrusions.

According to various embodiments, the protrusions of each of the metallization and the at least one electrically conductive contact region may fulfill a nucleation inducing height criterion.

According to various embodiments, the metallization may include or be formed from at least one contact pad.

According to various embodiments, each nucleation inducing topography feature of the segregation suppression structure may be configured to induce crystallite nucleation thereon such that a crystallographic interface is formed between adjacent nucleation inducing topography features of the segregation suppression structure.

According to various embodiments, each nucleation inducing topography feature of the segregation suppression structure may contact exactly one or exactly two crystallites of the metallization.

According to various embodiments, each nucleation inducing topography feature of the segregation suppression structure may contact exactly one crystallographic interface of the metallization.

According to various embodiments, at least one nucleation inducing topography feature of the segregation suppression structure may be disposed between two electrically conductive contact regions of the at least one electrically conductive contact region.

According to various embodiments, at least one nucleation inducing topography feature of the segregation suppression structure may be disposed between the at least one electrically conductive contact region and the metallization or the respective at least one contact pad.

According to various embodiments, the at least one electrically conductive contact region may include an ohmic characteristic.

According to various embodiments, the electronic component may further include a passivation layer disposed over the electronic component having at least one opening exposing the metallization or the respective at least one contact pad.

According to various embodiments, the electronic component may further include a metallization disposed on a side of the electronic component opposite the metallization or the respective at least one contact pad for electrically contacting the electronic component.

According to various embodiments, the at least one contact pad may include or be formed from a structured metallization.

According to various embodiments, the electronic component may further include a semiconductor region (e.g., electrically semiconducting); wherein the at least one electrically conductive contact region may protrude from the semiconductor region.

According to various embodiments, the segregation suppression structure may include or be formed from a structured metallization including the nucleation inducing topography features of the segregation suppression structure.

According to various embodiments, the segregation suppression structure may include or be formed from titanium.

According to various embodiments, the segregation suppression structure includes a greater roughness than the at least one electrically conductive contact region.

According to various embodiments, a roughness of the segregation suppression structure may be greater than a roughness of a surface of the electronic component between two electrically conductive contact regions of the at least one electrically conductive contact region.

According to various embodiments, each nucleation inducing topography feature of the segregation suppression structure may include or be formed from at least one of a protrusion and a recess.

According to various embodiments, each nucleation inducing topography feature of the segregation suppression structure may include or be formed from at least one edge.

According to various embodiments, an area density of crystallographic interfaces (of the metallization or the respective contact pad) induced by the at least one electrically conductive contact region may be less than an area density of crystallographic interfaces induced by the segregation suppression structure.

According to various embodiments, an area density of crystallites (of the metallization or the respective contact pad) may be greater than an area density of nucleation inducing topography features of the at least one electrically conductive contact region.

According to various embodiments, an averaged crystallite size (of the metallization or the respective contact pad) induced by the at least one electrically conductive contact region may be less than an averaged crystallite size induced by the segregation suppression structure.

According to various embodiments, the segregation suppression structure may include or be formed from a plurality of nucleation inducing topography features disposed between the at least one electrically conductive contact region and the metallization or the respective at least one contact pad.

According to various embodiments, a distance of two topography features of the segregation suppression structure may be less than a distance of two electrically conductive contact regions of the at least one electrically conductive contact region.

According to various embodiments, a distance of two topography features of the segregation suppression structure may be less than a distance of two topography features of the at least one electrically conductive contact region.

According to various embodiments, the self-segregating composition may include or be formed from at least two (two or more) different metals, e.g., a metal alloy including or formed from the at least two (two or more) different metals.

According to various embodiments, the self-segregating composition may include or be formed from two metals differing from each other in the sign of their standard electrode potential.

According to various embodiments, the self-segregating composition may include or be formed from a noble metal and a base metal.

According to various embodiments, the self-segregating composition may include or be formed from at least two metals differing in their electronegativity by more than or equal to about 0.3.

According to various embodiments, the self-segregating composition may include or be formed from at least one of copper and aluminum.

According to various embodiments, the at least one electrically conductive contact region may include or be formed from at least one of nickel and aluminum.

According to various embodiments, the at least one electrically conductive contact region may be in physical contact with a doped region of the electronic component.

According to various embodiments, the at least one electrically conductive contact region may be in physical contact with a region of the electronic component doped with a metal of the at least one electrically conductive contact region.

According to various embodiments, the segregation suppression structure may be in physical contact with the metallization or the respective at least one contact pad.

According to various embodiments, the self-segregating composition may be configured to chemical segregate by heating the metallization or the respective at least one contact pad.

According to various embodiments, the electronic component may include or be formed from at least one power electronic component.

According to various embodiments, the electronic component may include or be formed from at least one of a diode and a transistor.

According to various embodiments, the electronic component may include or be formed from a microelectromechanical system.

According to various embodiments, the at least one electrically conductive surface may be electrically contacted by the metallization via the segregation suppression structure.

According to various embodiments, the electronic component may include or be formed from at least one of an electrical component (e.g., having one or more unipolar junctions); an electromechanical component; an optoelectrical component; and/or an optoelectromechanical component.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An electronic component comprising:
at least one electrically conductive contact region;
a contact pad comprising a self-segregating composition disposed over the at least one electrically conductive contact region;
a segregation suppression structure disposed between the contact pad and the at least one electrically conductive contact region, and
wherein the segregation suppression structure comprises more nucleation inducing topography features than the at least one electrically conductive contact region for perturbing a chemical segregation of the self-segregating composition by crystallographic interfaces of the contact pad defined by the nucleation inducing topography features.

2. The electronic component of claim 1,
wherein the segregation suppression structure comprises a greater area density of nucleation inducing topography features than the at least one electrically conductive contact region for spatially limiting a chemical segregation of the self-segregating composition to a crystallite size of the contact pad defined by the area density of the nucleation inducing topography features.

3. The electronic component of claim 1,
wherein each nucleation inducing topography feature of the segregation suppression structure is configured to induce crystallite nucleation thereon such that a crystallographic interface is formed between adjacent nucleation inducing topography features of the segregation suppression structure.

4. The electronic component of claim 1,
wherein at least one nucleation inducing topography feature of the segregation suppression structure is disposed between two electrically conductive contact regions of the at least one electrically conductive contact region.

5. The electronic component of claim 1,
wherein the at least one electrically conductive contact region comprises an ohmic characteristic.

6. The electronic component of claim 1, wherein the electronic component further comprises:

a passivation layer disposed over the contact pad and having at least one opening exposing the contact pad.

7. The electronic component of claim 1, wherein the electronic component further comprises:
a metallization disposed on a side of the electronic component opposite the contact pad for electrically contacting the electronic component.

8. The electronic component of claim 1,
wherein the contact pad comprises a structured metallization.

9. The electronic component of claim 8,
wherein the structured metallization exposes the segregation suppression structure at least partially.

10. The electronic component of claim 1, wherein the electronic component further comprises:
a semiconductor region, wherein the at least one electrically conductive contact region protrudes from the semiconductor region.

11. The electronic component of claim 1,
wherein the segregation suppression structure comprises a structured metallization comprising the nucleation inducing topography features of the segregation suppression structure.

12. The electronic component of claim 1,
wherein the segregation suppression structure comprises titanium.

13. The electronic component of claim 1,
wherein the segregation suppression structure comprises a greater roughness than the at least one electrically conductive contact region.

14. The electronic component of claim 1,
wherein each nucleation inducing topography feature of the segregation suppression structure comprises at least one of a protrusion and a recess.

15. The electronic component of claim 1,
wherein a distance of two topography features of the segregation suppression structure is less than a distance of two electrically conductive contact regions of the at least one electrically conductive contact region.

16. The electronic component of claim 1,
wherein the self-segregating composition comprises a noble metal and a base metal.

17. The electronic component of claim 1,
wherein the electronic component comprises at least one power electronic component.

18. The electronic component of claim 1,
wherein the electronic component comprises at least one of
an electrical component;
an electromechanical component;
an optoelectrical component; and/or
an optoelectromechanical component.

19. An electronic component comprising,
at least one electrically conductive surface;
a metallization comprising a self-segregating composition disposed over the at least one electrically conductive surface;
a segregation suppression structure disposed between the metallization and the at least one electrically conductive surface,
wherein the segregation suppression structure comprises more nucleation inducing topography features than the at least one electrically conductive surface for perturbing a chemical segregation of the self-segregating composition by crystallographic interfaces of the metallization defined by the nucleation inducing topography features.

20. An electronic component comprising:
at least one electrically conductive surface;
a metallization comprising a self-segregating composition disposed over the at least one electrically conductive surface;
a segregation suppression structure disposed between the metallization and the at least one electrically conductive surface,
wherein the segregation suppression structure comprises a greater area density of nucleation inducing topography features than the at least one electrically conductive surface for perturbing a chemical segregation of the self-segregating composition by crystallographic interfaces of the metallization defined by the nucleation inducing topography features.

* * * * *